United States Patent
Miki

(10) Patent No.: US 8,642,992 B2
(45) Date of Patent: Feb. 4, 2014

(54) GROUP III NITRIDE COMPOUND SEMICONDUCTOR LIGHT EMITTING DEVICE

(75) Inventor: Hisayuki Miki, Chiba (JP)

(73) Assignee: Toyoda Gosei Co., Ltd., Aichi (JP)

( * ) Notice: Subject to any disclaimer, the term of this patent is extended or adjusted under 35 U.S.C. 154(b) by 178 days.

(21) Appl. No.: 12/614,111

(22) Filed: Nov. 6, 2009

(65) Prior Publication Data

US 2010/0148150 A1 Jun. 17, 2010

(30) Foreign Application Priority Data

Dec. 3, 2008 (JP) .................................. 2008-308665

(51) Int. Cl.
*H01L 33/00* (2010.01)
(52) U.S. Cl.
USPC ........ 257/13; 257/14; 257/103; 257/E33.008; 257/E33.023; 438/47
(58) Field of Classification Search
USPC .............. 257/13, 14, E33.008, E33.023, 103; 438/47
See application file for complete search history.

(56) References Cited

U.S. PATENT DOCUMENTS

| | | |
|---|---|---|
| 2003/0160229 A1 | 8/2003 | Narayan et al. |
| 2006/0256825 A1* | 11/2006 | Matsumura et al. ....... 372/43.01 |
| 2007/0284588 A1* | 12/2007 | Kinoshita ...................... 257/79 |

FOREIGN PATENT DOCUMENTS

| | | |
|---|---|---|
| JP | 10-79501 A | 3/1998 |
| JP | 11-214744 A | 8/1999 |
| JP | 11-354839 A | 12/1999 |
| JP | 2001-68733 A | 3/2001 |
| JP | 2004-266240 A | 9/2004 |
| JP | 2007-243219 A | 9/2007 |
| WO | 2008/081717 A1 | 7/2008 |
| WO | 2008/087930 A1 | 7/2008 |

OTHER PUBLICATIONS

Japanese Office Action ("Notice of Reasons for Rejection") dated Oct. 16, 2012 for corresponding Japanese Patent Application No. 2008-308665.
Japanese Office Action ("Notice of Reasons for Rejection"), in corresponding Japanese Patent Application No. 2008-308665, dated May 28, 2013.

* cited by examiner

*Primary Examiner* — Ori Nadav
*Assistant Examiner* — Vernon P Webb
(74) *Attorney, Agent, or Firm* — Sughrue Mion, PLLC

(57) ABSTRACT

A Group III nitride compound semiconductor light emitting device is provided which has: an n-type semiconductor layer (12); an active layer (13) of a multiple quantum well structure laminated on the n-type semiconductor layer (12); a first p-type semiconductor layer (14) that is a layer of a superlattice structure in which an undoped film (14a) that has a composition $Al_xGa_{1-x}N$ (x indicating composition ratio, being within a range $0<x\leq0.4$) and that contains no dopant, and a doped film (14b) that has a composition $Al_yGa_{1-y}N$ (y indicating composition ratio, being within a range $0\leq y<0.4$) and that contains a dopant, are alternately laminated a plurality of times, and a surface thereof on the active layer side (13) is constituted by the undoped film (14a); and a second p-type semiconductor layer (15) laminated on the first p-type semiconductor layer (14).

10 Claims, 5 Drawing Sheets ated States Patent

US 8,642,992 B2

GROUP III NITRIDE COMPOUND SEMICONDUCTOR LIGHT EMITTING DEVICE

TECHNICAL FIELD

The present invention relates to a Group III nitride compound semiconductor light emitting device and a manufacturing method thereof.

This application claims the priority of Japanese Patent Application No. 2008-308665, filed on Dec. 3, 2008, the contents of which are incorporated herein by reference.

BACKGROUND ART

In recent years, a Group III nitride compound semiconductor has been receiving attention as a semiconductor material for light emitting devices that emit short-wavelength light. In general, with various types of crystalline oxides, silicon carbide, single crystals, Group III-V compound semiconductor single crystals, or the like, such as sapphire single crystals, serving as a substrate, a Group III nitride compound semiconductor is laminated and formed thereon by means of a metal organic chemical vapor deposition method (MOCVD method), a molecular beam epitaxy method (MBE method), or a hydride vapor phase epitaxy method (HVPE method).

The crystal growth method widely used at present is a method wherein sapphire, SiC, GaN, AlN, or the like is used as a substrate, and fabrication is performed thereon by means of a metal organic chemical vapor deposition method (MOCVD method), in which a Group III organic metallic compound and a group-V material gas are used in a reaction tube having the above substrate installed therein, to thereby grow an n-type semiconductor layer, an active layer, and a p-type semiconductor layer, in a temperature region of 700° C. to 1200° C.

After the respective semiconductor layers have been grown, a negative electrode is formed on the substrate or on the n-type semiconductor layer, and a positive electrode is formed on the p-type semiconductor layer, to thereby obtain a light emitting device.

A conventional active layer employs: a double hetero structure in which InGaN, the composition of which has been adjusted for adjusting light emission wavelength, is used and this active layer is sandwiched by layers with a bandgap higher than that of InGaN; or a multiple quantum well structure in which the quantum well effect is used (for example, refer to Patent Documents 1 to 4).

Moreover, the p-type semiconductor layer is generally constituted by: a p-type clad layer that has a bandgap greater than that of the active layer and that has a functionality to block, with a potential barrier based on the gap difference therebetween, electrons and holes; and a p-type contact layer to which a p-type electrode is to be joined.

[Patent Document 1] Japanese Unexamined Patent Application, First Publication No. H10-79501
[Patent Document 2] Japanese Unexamined Patent Application, First Publication No. H11-354839
[Patent Document 3] Japanese Unexamined Patent Application, First Publication No. 2001-68733

DISCLOSURE OF INVENTION

Problems to be Solved by the Invention

Incidentally, in the conventional p-type clad layer, an Mg-doped GaN layer or an AlGaN layer where a part of the Ga is replaced with Al, is used in general. However, hole injection to the active layer is insufficient and sufficient improvement in output can not be achieved.

Moreover, there is a problem in that in a gallium nitride-based compound semiconductor light emitting device having an active layer of a multiple quantum well structure, if the film thickness of a well layer is approximately 20 to 30 Å where the thickness of a barrier layer that constitutes the active layer is approximately 70 to 140 Å, excellent output can be obtained but the driving voltage becomes high.

The present invention takes into consideration the above circumstances, with an object of providing a Group III nitride compound semiconductor light emitting device having a high level of light emission output, an illuminating device, and a method of manufacturing the Group III nitride compound semiconductor light emitting device.

Means for Solving the Problem

In order to achieve the above object, the present invention employs the following configuration.

[1] A Group III nitride compound semiconductor light emitting device having: an n-type semiconductor layer, an active layer of a multiple quantum well structure laminated on the n-type semiconductor layer, a first p-type semiconductor layer laminated on the active layer, and a second p-type semiconductor layer laminated on the first p-type semiconductor layer, wherein the first p-type semiconductor layer is a layer of a superlattice structure in which an undoped film that has a composition $Al_xGa_{1-x}N$ (x indicating composition ratio, being within a range $0<x\leq0.4$) and that contains no dopant, and a doped film that has a composition $Al_yGa_{1-y}N$ (y indicating composition ratio, being within a range $0\leq y<0.4$) and that contains a dopant, are alternately laminated a plurality of times; and a surface thereof on the active layer side is constituted by the undoped film.

[2] The Group III nitride compound semiconductor light emitting device according to [1], wherein a dopant concentration of a plurality of the doped films that constitute the first p-type semiconductor layer is constant.

[3] The Group III nitride compound semiconductor light emitting device according to [1], wherein a dopant concentration of the doped film arranged closest to the active layer, among the plurality of doped films that constitute the first p-type semiconductor layer, is higher than a dopant concentration of other doped films.

[4] The Group III nitride compound semiconductor light emitting device according to [1], wherein the doped film is constituted by GaN.

[5] The Group III nitride compound semiconductor light emitting device according to [1], wherein the active layer is of a multiple well structure in which a well layer, and a barrier layer with a film thickness of 20 Å or more and less than 70 Å, are alternately laminated a plurality of times.

[6] The Group III nitride compound semiconductor light emitting device according to [1], wherein the first p-type semiconductor layer is a p-type clad layer, and the second p-type semiconductor layer is a p-type contact layer.

[7] The illuminating device, provided with a Group III nitride compound semiconductor light emitting device according to [1].

[8] A method of manufacturing a Group III nitride compound semiconductor light emitting device, wherein the method comprising the steps of: a step of forming undoped films, on a laminated film in which an n-type semiconductor layer and an active layer of a multiple quantum well structure are laminated, the processes including: a process where there are alternately performed in a repeated manner; an undoped film formation process in which an undoped film that has a composition $Al_xGa_{1-x}N$ (x indicating composition ratio, being within a range of $0<x\leq0.4$) and that contains no dopant is laminated by means of a MOCVD method with use of a first reactive gas at least containing an Al source, a Ga source, and a nitrogen source, and a doped film formation process in which a doped film that has a composition $Al_yGa_{1-y}N$ (y indicating composition ratio, being within a range of $0\leq y<0.4$) and that contains a dopant is laminated by means of the MOCVD method with use of a second reactive gas at least containing a Ga source, a nitrogen source, and a dopant source, to thereby form a first p-type semiconductor layer of a superlattice structure in which the undoped film and the doped film are alternately laminated a plurality of times; and a step, in which a second p-type semiconductor layer is laminated on the first p-type semiconductor layer.

[9] The method of manufacturing a Group III nitride compound semiconductor light emitting device according to [8], wherein, a pause process is between the undoped film formation process and the doped film formation process.

[10] The method of manufacturing a Group III nitride compound semiconductor light emitting device according to [8], wherein the undoped film formation process and the doped film formation process are performed continuously.

Effect of the Invention

According to the present invention, there can be provided a Group III nitride compound semiconductor light emitting device having a high level of light emission output, an illuminating device, and a method of manufacturing a Group III nitride compound semiconductor light emitting device.

DESCRIPTION OF THE REFERENCE SYMBOLS 1, 2: light emitting device (Group III nitride compound semiconductor light emitting device), 3: lamp (illuminating device), 12: n-type semiconductor layer, 13: light emitting layer (active layer), 13a: barrier layer, 13b: well layer, 14: p-type clad layer (first p-type semiconductor layer), 14a, 114a: undoped film, 14b, 114b, 114m: doped film, and 15: p-type contact layer (second p-type semiconductor layer).

BEST MODE FOR CARRYING OUT THE INVENTION

First Embodiment

Figure 1:
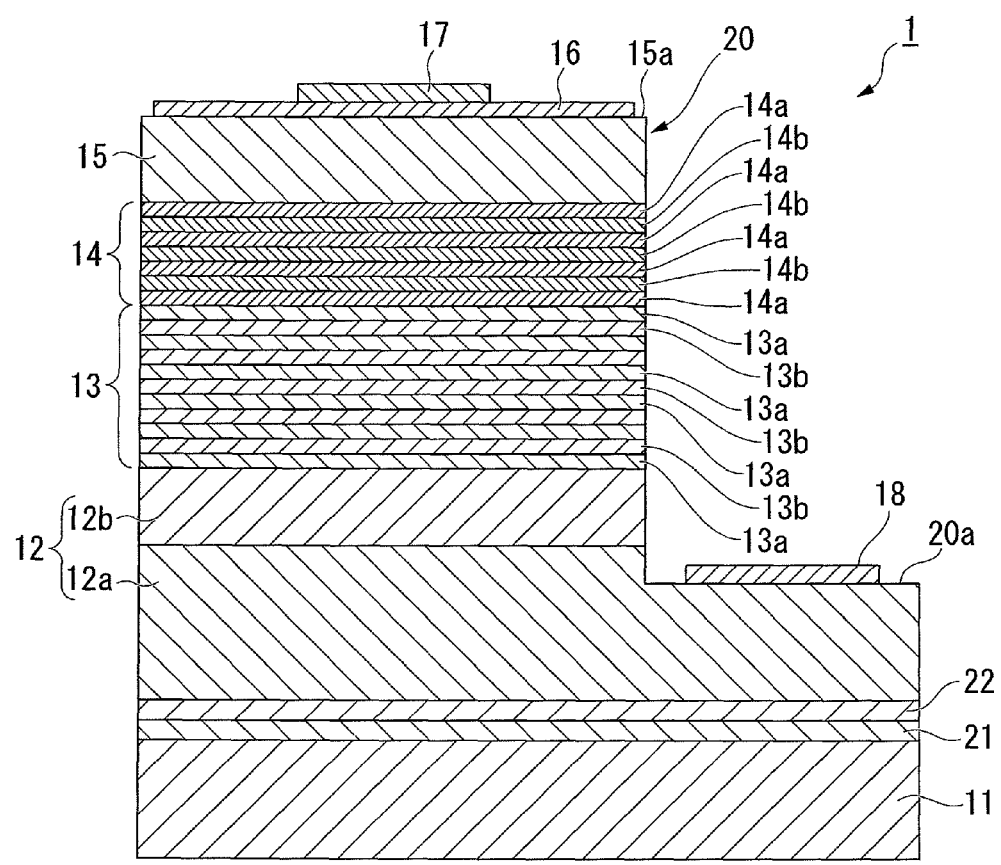
FIG. 1 is a schematic sectional view of a Group III nitride compound semiconductor light emitting device of a first embodiment of the present invention.

Hereunder, there are described, with reference to accompanying drawings, a Group III nitride compound semiconductor light emitting device (hereunder, referred to as a light emitting device) of a first embodiment of the present invention, and a lamp provided with the light emitting device. FIG. 1 is a schematic sectional view of the light emitting device of the present embodiment. The drawings referenced in the following description are drawings for describing the semiconductor light emitting device and the lamp, in which the size, thickness, dimension, and the like of each section illustrated therein may differ from the dimensional relationship of an actual semiconductor light emitting device and the like.

"Light Emitting Device"

As shown in FIG. 1, a semiconductor light emitting device 1 of the present embodiment is provided with: a substrate 11; a laminated semiconductor layer 20 including an active layer (hereunder, referred to as a light emitting layer) 13 laminated on the substrate 11; a transparent electrode 16 laminated on the upper surface of the laminated semiconductor layer 20; a p-type bonding pad electrode 17 laminated on the transparent electrode 16; and an n-type electrode 18 laminated on an exposed surface 20a of the laminated semiconductor layer 20. The light emitting device 1 of the present embodiment is a face-up mount type light emitting device that takes out the light from the light emitting layer 13 primarily from the side on which the p-type bonding pad electrode 17 is formed.

As shown in FIG. 1, the laminated semiconductor layer 20 is configured with a plurality of laminated semiconductor layers. More specifically, the laminated semiconductor layer 20 is configured such that an n-type semiconductor layer 12, the light emitting layer 13, a p-type clad layer 14 (first p-type semiconductor layer), and a p-type contact layer 15 (second p-type semiconductor layer) are laminated in this order from the substrate 11 side.

Moreover, as shown in FIG. 1, the p-type contact layer 15, the p-type clad layer 14, the light emitting layer 13, and the n-type semiconductor layer 12 have a part thereof removed by means of etching or the like, and a part of the n-type semiconductor layer 12 is exposed from the removed portion. On the exposed surface 20a of this n-type semiconductor layer 12, there is laminated the n-type electrode 18.

Furthermore, on an upper surface 15a of the p-type contact layer 15, there are laminated the transparent electrode 16 and the p-type bonding pad electrode 17. These transparent electrode 16 and p-type bonding pad electrode 17 constitute a p-type electrode.

As a semiconductor that constitutes the n-type semiconductor layer 12, the light emitting layer 13, the p-type clad layer 14, and the p-type contact layer 15, it is preferable that a Group III nitride semiconductor be used, and use of a gallium nitride-based compound semiconductor is further preferable. As the gallium nitride-based compound semiconductor, there are widely known semiconductors of various compositions expressed by the general formula: $Al_mIn_nGa_{1-m-n}N$ ($0\leq m<1$, $0\leq n<1$, $0\leq m+n<1$) where a part of the Ga of gallium nitride (GaN) is replaced with Al and/or In. Also, as the gallium nitride compound semiconductor that constitutes the n-type semiconductor layer 12, the light emitting layer 13, and the p-type contact layer 15 in the present invention, it is possible, without any limitation, to use semiconductors of various compositions expressed by the general formula: $Al_mIn_nGa_{1-m-n}N$ ($0\leq m<1$, $0\leq n<1$, $0\leq m+n<1$). The composition of the p-type clad layer 14 is described later.

In the light emitting device 1 of the present embodiment, electric current is passed between the p-type bonding pad electrode 17 and the n-type electrode 18, thereby causing the light emitting layer 13 to emit light.

Hereunder, a configuration of the light emitting device 1 is described in detail.

(Substrate)

As the substrate 1 of the light emitting device 1, provided that it is a substrate on the surface of which Group III nitride semiconductor crystals can be epitaxially grown, there may be used, without particular limitation, a substrate constituted by materials such as sapphire, SiC, silicon, zinc oxide, magnesium oxide, magnesium oxide, zirconium dioxide, iron zinc manganese oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, and molybdenum. In particular, it is preferable that a sapphire substrate with a c-plane serving as a principal plane be used as the substrate 11. In a case of using a sapphire substrate, on the c-plane of the sapphire there may be formed an intermediate layer 21 (buffer layer).

(Buffer Layer)

It is preferable that the buffer layer 21 be constituted by polycrystal $Al_aGa_{1-a}N$ ($0 \leq a \leq 1$), and a single crystal $Al_aGa_{1-a}N$ ($0 \leq a \leq 1$) is more preferable. The preferable thickness of the buffer layer 21 falls within a range of 0.01 μm to 0.5 μm. If the thickness of the buffer layer 21 is less than 0.01 μm, then in some cases an effect of the buffer layer 21 mitigating differences in the grating constant between the substrate 11 and a foundation layer 22 may not be sufficiently obtained. Moreover, if the thickness of the buffer layer 21 exceeds 0.5 μm, there is a possibility that the amount of time required for a film formation process of the buffer layer 21 may increase, despite no change in the functionality of the buffer layer 21, and productivity may be consequently reduced.

The buffer layer 21 mitigates difference in the grating constant between the substrate 11 and the foundation layer 22, and serves to facilitate formation of a single crystal layer that is C-axis-aligned on the C-plane of the substrate 11 constituted by sapphire. Therefore, if the single crystal foundation layer 22 is laminated on the buffer layer 21 for example, it is possible to laminate the foundation layer 22 having better crystallinity.

The buffer layer 21 has a hexagonal crystal structure constituted by a Group III nitride semiconductor. The Group III nitride semiconductor that constitutes the buffer layer 21 preferably has a single crystal structure. A crystal of a Group III nitride semiconductor, by controlling growth conditions thereof, grows not only in an upward direction but also in an in-plane direction, forming a single crystal structure. Therefore, by controlling conditions of film formation of the buffer layer 21, it is possible to have the buffer layer 21 constituted by a Group III nitride semiconductor having a single crystal structure. In a case where the buffer layer 21 having such a single crystal structure is formed on the substrate 11, the buffering function of the buffer layer 21 acts effectively, and consequently the Group III nitride semiconductor formed thereon becomes a crystalline film having excellent alignment and crystallinity.

Moreover, the Group III nitride semiconductor that constitutes the buffer layer 21, may be made by controlling film formation conditions thereof as a column crystal (polycrystal) formed with a hexagonal-crystal based aggregate structure. The column crystal formed with a aggregate structure here refers to a crystal in which adjacent crystal grains are separated by a crystal grain boundary formed therebetween and the column crystal itself has a cross-sectionally column shape.

(Foundation Layer)

Specific examples of the foundation layer 22 include $Al_pGa_qIn_rN$ ($0 \leq p \leq 1$, $0 \leq q \leq 1$, $0 \leq r \leq 1$, $p+q+r=1$), however, use of $Al_sGa_{1-s}N$ ($0 \leq s < 1$) is preferable as it enables formation of the foundation layer 22 having excellent crystallinity. The film thickness of the foundation layer 22 is preferably 0.1 μm or more, more preferably 0.5 μm, and most preferably 1 μm or more. With these film thicknesses or greater, $Al_sGa_{1-s}N$ having excellent crystallinity is easily obtained.

In order to improve the crystallinity of the foundation layer 22, the foundation layer 22 is preferably such that impurities are not doped. However, in a case where n-type conductivity is required, a dopant may be added.

In a case where a dopant is added to the foundation layer 22, the foundation layer 22 functions as the n-type semiconductor layer 12.

(N-Type Semiconductor Layer)

The n-type semiconductor layer 12 is generally constituted by an n-type contact layer 12a and an n-type clad layer 12b. The n-type contact layer 12a can also serve as the n-type clad layer 12b. Moreover, the foundation layer 12 described above may be included in the n-type semiconductor layer 12.

The n-type contact layer 12a is a layer for providing the n-type electrode 18. The n-type contact layer 12a is preferably constituted by a layer of $Al_bGa_{1-b}N$ ($0 \leq b < 1$, more preferably $0 \leq b \leq 0.5$, and most preferably $0 \leq b \leq 0.1$). Moreover, preferably the n-type contact layer 12a has doped n-type impurities, and it is preferable in terms of maintaining excellent ohmic contact with the n-type electrode 18, if n-type impurities are contained at a concentration of $1 \times 10^{17}$ to $1 \times 10^{20}/cm^3$ or more preferably $1 \times 10^{18}$ to $1 \times 10^{19}/cm^3$. The n-type impurities are not particularly limited, however, specific examples of the n-type impurity include Si, Ge, and Sn, and preferably Si or Ge.

The film thickness of the n-type contact layer 12a is preferably 0.5 to 5 μm, and is set preferably within a range of 1 to 3 μm. If the film thickness of the n-type contact layer 12a is within the above range, crystallinity of the semiconductor is maintained well.

It is preferable to provide a n-type clad layer 12b between the n-type contact layer 12a and the light emitting layer 13. The n-type clad layer 12b is a layer for injecting carriers into the light emitting layer 13 and confining carriers in the light emitting layer 13. The n-type clad layer 12b may be formed with AlGaN, GaN, GaInN, or the like. Moreover, the n-type clad layer ca be formed as a heterojunction of these structures or a superlattice structure in which these structures are laminated a plurality of times. Needless to say, in a case of forming the n-type clad layer 12b with GaInN, the bandgap thereof is preferably made greater than that of GaInN of the light emitting layer 13.

The film thickness of the n-type clad layer 12b is not particularly limited, however, it is preferably 0.005 to 0.5 μm, or more preferably 0.005 to 0.1 μm. Dopant concentration of the n-type clad layer 12b is preferably $1 \times 10^{17}$ to $1 \times 10^{20}/cm^3$, or more preferably $1 \times 10^{18}$ to $1 \times 10^{19}/cm^3$. If the dopant concentration is within this range, this is preferable in terms of maintaining excellent crystallinity and reducing device operating voltage.

In a case where the n-type clad layer 12b is a layer containing a superlattice structure, although the detailed illustration is omitted, it may include a structure in which an n-side first layer constituted by a Group III nitride semiconductor having a film thickness 100 Å or less, and an n-side second layer that has a composition different from that of the n-side first layer and that is constituted by a Group III nitride semiconductor having a film thickness 100 Å or less, are laminated. Moreover, the n-type clad layer 12b may include a structure in which the n-side first layer and the n-side second layer are alternately and repeatedly laminated. Furthermore, preferably, there may be provided a structure in which either one of the n-side first layer and the n-side second layer is in contact with the light emitting layer 13.

The n-side first layer and the n-side second layer may have a composition of, for example, AlGaN containing Al (may be simply represented as AlGaN in some cases), GaInN containing In (may be written simply as GaInN in some cases), or GaN. Moreover, the n-side first layer and the n-side second layer may be of: an alternating structure of GaInN/GaN; an alternating structure of AlGaN/GaN; an alternating structure of GaInN/AlGaN; an alternating structure of GaInN/GaInN having different compositions (the phrase "having different compositions" in the present invention describes that each elemental composition ratio is different, and the same applies hereunder); or an alternating structure of AlGaN/AlGaN having different compositions. In the present invention, the n-side first layer and the n-side second layer are preferably of an alternating structure of GaInN/GaN or GaInN/GaInN having different compositions.

The preferred superlattice of the n-side first layer and the n-side second layer is respectively 60 Å or less, more preferably 40 Å or less, and most preferably within a range between 10 Å and 40 Å. If the film thickness of the n-side first layer and the n-side second layer that form a superlattice layer exceeds 100 Å, crystal defects are likely to occur and hence this is not preferable.

The n-side first layer and the n-side second layer may each be of a doped structure. Moreover, they may be of a combination of a doped structure and undoped structure. As an impurity to be doped, a conventionally known one may be applied to the abovementioned material compositions without any limitation. For example, in a case where as the n-type clad layer, there is used one of an alternating structure of GaInN/GaN or of an alternating structure of GaInN/GaInN having a different composition, Si is suitable as an impurity. Moreover, the n-side superlattice multilayered film mentioned above may, even with the same composition represented by GaInN, AlGaN, or GaN, be fabricated while appropriately turning the doping ON or OFF.

(Light Emitting Layer)

The light emitting layer 13 is of a multiple well structure in which barrier layers 13a and well layers 13b are alternately laminated a plurality of times. The preferred number of laminations in the multiple well structure is three to ten times, or more preferably four to seven times. Moreover, the barrier layer 13a is always present on the n-type semiconductor layer 12 side surface and p-type clad layer 14 side surface of the light emitting layer 13. Thereby, electrons and holes can be effectively enclosed within the light emitting layer 13, and light emitting efficiency can be increased. In particular, the barrier layer 13a arranged on the side closest to the p-type clad layer 14 also has a function of blocking diffusion of impurities from the p-type clad layer 14. Dopant diffusion in the p-type clad layer 14 due to time degradation is an example of diffusion of impurities of the p-type clad layer 14.

The preferred thickness of the well layer 13b is within a range between 15 Å or more and 50 Å or less, or more preferably within a range between 20 Å or more and 35 Å or less. If the thickness of the well layer 13b is other than the thickness described above, a reduction in light emission output becomes more likely.

The well layer 13b is preferably a gallium nitride-based compound semiconductor containing In. This is because a gallium nitride-based compound semiconductor containing In is of a crystal system that is likely to become a structure having a thin film section by means of a method described later. Moreover, a gallium nitride-based compound semiconductor containing In is capable of performing light emission in a blue wavelength region at a high level of intensity.

In a case where the well layer 13b is of a gallium nitride-based compound semiconductor containing In, it is preferable that a thin layer that does not contain In be provided on the surface of the well layer 13b. This is preferable as it suppresses decomposition and sublimation of In within the active layer, and enables stable control of the light emission wavelength.

Moreover, an impurity may be doped in the well layer 13b. As a dopant, Si or Ge, which is known as a donor, is suitable for enhancing light emission intensity. The suitable of amount of doping is approximately $1 \times 10^{17}$ cm$^{-3}$ to $1 \times 10^{18}$ cm$^{-3}$. If the doping amount exceeds this, it causes a reduction in light emission intensity.

Next, the preferable film thickness of the barrier layer 13a is within a range between 20 Å or more and less than 70 Å, or more preferably within a range between 20 Å or more and 50 Å or less. If the film thickness of the barrier layer 13a is too thin, it inhibits planarization of the upper surface of the barrier layer 13a and causes a reduction in the light emission efficiency and a degradation in aging characteristics. Moreover, if the film thickness is too thick, then it causes a rise in driving voltage and a reduction in light emission. Therefore, it is preferable that the film thickness of the barrier layer 13a be 50 Å or less.

Moreover, other than using GaN and AlGaN, the barrier layer 13a may be formed with GaInN having an In ratio lower than that of GaInN that constitutes the well layer. However of these, GaN is ideal.

Moreover, it is preferable that no dopant be doped in the barrier layer 13a.

Furthermore, in the well layer 13b, there may be provided a plurality of thin film sections. These thin film sections are formed in a way such that a part of the upper surface of each well layer 13b is removed through evaporation or decomposition. In a case of a multiple quantum well structure, all of the well layers 13b do not have to be provided with the thin film section, and moreover, the dimension or area ratio of the thin film section may be varied for each layer.

The thin film section refers to a portion with a thickness thereof that is less than the average thickness of the well layer 13b. Determination and measurement of the thin film section can be done on a cross-sectional TEM photograph of the laminated semiconductor layer 20. For example, if observed on a cross-sectional TEM photograph magnified 0.5 million times to 2 million times, the film thickness of the well layer 13b of the thin film section, and the film thickness of the well layer 13b of a portion with no thin film section formed thereon, can be measured.

The thickness of the thin film section may be constant among the thin film sections in some cases, and it may have a different thickness for each of the thin film sections in some cases. As for the thickness of the thin film section in a case where the thickness is different for each of the thin film sections, an average thickness of the thin film sections in several locations to several tens of locations observed on the cross-sectional TEM photograph may be taken as the thickness.

The preferred thickness of the well layer 13b in the thin film section is within a range between 0 Å or more and 20 Å or less, or more preferably within a range between 2 Å or more and 15 Å or less. Furthermore, the difference in film thickness between the thin film sections and the well layer 13b excluding the thin film sections, is preferably within a range between 5 Å or more and 50 Å or less, or more preferably within a range between 5 Å or more and 35 Å or less.

If the thickness of the well layer 13b excluding the thin film sections is other than the thickness described above, a reduction in light emission output becomes more likely. Moreover, the thin film sections may include regions with a thickness 0 nm, that is, regions with no well layer at all. However, such regions are preferably few as they cause a reduction in light emission output.

Moreover, the well layer 13b having the thin film sections, has a structure such that the n-type semiconductor layer 12 side surface is a flat surface, the p-type clad layer 14 side surface is a concavo-convex surface, and this concavo-convex surface forms the thin film sections. In the case of such a structure, a reduction in light emission intensity is unlikely to occur, and moreover there is an effect of suppressing deterioration associated with aging. The flat surface here refers to a case where for example, the concavo-convex depth thereof observed on the above cross-sectional TEM photograph is 1 nm or less. Or, more preferably it is 0.5 nm or less, and it is particularly preferable that the concavities and convexities be almost invisible.

Moreover, in a case where the concavo-convex depth of the n-type semiconductor layer 12 side surface is ⅕ or less compared to the size of the concavo-convex depth of the p-type clad layer 14 side surface, it can be said that the crystallinity of the barrier layer 13a present on the n-type semiconductor layer 12 side of the well layer 13b is sufficiently high, and is effective for characteristic improvement. Above all, it is more preferably 1/10 or less, and it is most preferable that the n-type semiconductor layer 12 side surface of the well layer 13b be flat and the concavities and convexities be invisible. Therefore, it is preferable that the barrier layer 13a fills in the thin film sections of the well layer 13b and thereby the upper surface thereof be flat. Thereby, the n-type semiconductor layer 12 side surface of the next well layer 13b becomes flat.

A preferable state of the shape and distribution of the thin film sections of the well layer 13b in plan view is such that for example, on the p-type clad layer 14 side surface of the well layer 13b, there are arranged a plurality of the independent thin film sections that are regularly or irregularly distributed. The shape of the thin film sections in plan view may be any one of a circular shape, an oval shape, or an indeterminate shape, and these shapes may also be mixed.

The preferred area ratio of the thin film sections with respect to the entire well layer 13b is 30% or less, more preferably 20% or less, and most preferably 10% or less. With the area ratio 30% or less, it is possible to prevent a reduction in light emission efficiency, and it is also possible to reduce the driving voltage and maintain the output at the same time.

The width of the thin film section of the laminated semiconductor layer 20 in sectional view is preferably within a range between 1 nm and 100 nm. It is more preferably 5 nm to 50 nm.

Moreover, when the portions of the well layer 13b excluding the thin film sections are taken as thick film sections, the preferable area of the thick film sections is 30 to 90% of the entire well layer 13b, and thereby it is possible to reduce the driving voltage and maintain the output at the same time. More preferably, the region covered by the thick film sections is greater than the region covered by the thin film sections, that is to say, the area ratio of the thick film section is 50% to 90% of the entire area.

(P-Type Clad Layer)

The p-type clad layer 14 is a layer for confining and injecting a carrier into the light emitting layer 13.

As shown in FIG. 1, the p-type clad layer 14 of the present embodiment is a layer in a superlattice structure in which undoped films 14a and doped films 14b are alternately laminated a plurality of times. Moreover, the p-type clad layer 14 is configured such that the undoped films 14a are arranged respectively on the light emitting layer 13 side surface and on the p-type contact layer 15 side surface.

It is preferable that compositions of the undoped film 14a and the doped film 14b be a composition with a bandgap energy greater than that of the light emitting layer 13, so that the film composition is capable of confining the carrier into the light emitting layer 13.

Specifically, the undoped film 14a preferably has a composition $Al_xGa_{1-x}N$ (x indicating composition ratio, being within a range $0<x\leq0.4$) and does not contain a dopant. The more preferable range of the composition ratio x is $0<x\leq0.2$, and the most preferable range is $0<x\leq0.1$. The undoped film 14a is configured with an AlGaN-based semiconductor that does not contain a dopant as described above, and it is consequently possible to increase the crystallinity of the undoped film 14a. Thus, the crystallinity of the entire p-type clad layer 14 is improved and a reduction in the driving voltage becomes possible. Moreover, the undoped film 14a contains Al, and consequently the carrier can be confined in the light emitting layer 13 easily. However, since the crystallinity of the undoped film 14a decreases if the composition ratio of Al is too high, it is preferable that the upper limit of the composition ratio x be set as described above.

Furthermore, the undoped film 14a arranged closest to the light emitting layer also has a function of blocking diffusion of impurities from the p-type clad layer 14 into the light emitting layer 13. Dopant diffusion of the p-type clad layer 14 due to thermal history in the manufacturing process is an example of diffusion of impurities of the p-type clad layer 14.

Next, the doped film 14b is preferably of an $Al_yGa_{1-y}N$ composition (y indicating composition ratio, being within a range of $0\leq y<0.4$) and contains a dopant. The more preferable range of the composition ratio y is $0\leq y<0.1$, and the most preferable range is $0\leq y<0.05$. If the composition ratio y of Al is made smaller, the dopant can be doped into the doped film 14b easily. Therefore, it is most preferable that the doped film 14b in the present embodiment be constituted by GaN, the composition ratio y of which is 0. Moreover, in order to have the carrier generated and moved efficiently, the difference between x and u is important. That is to say, it is preferably $0<(x-y)\leq0.4$, the more preferable range is $0.01\leq(x-y)\leq0.2$, or the most preferable range is $0.03\leq(x-y)\leq0.1$. Moreover, Mg is a preferable dopant. Furthermore, the preferable dopant concentration in the doped film 14b is within a range from $1\times10^{16}$ to $5\times10^{21}$ cm$^{-3}$, more preferably within a range from $1\times10^{17}$ to $1\times10^{21}$ cm$^{-3}$, and most preferably within a range from $1\times10^{18}$ to $5\times10^{20}$ cm$^{-3}$. Moreover, it is preferable that the dopant concentration of the plurality of doped films 14b constituting the p-type clad layer 14 be constant.

The doped film 14b is configured with an impurity semiconductor constituted by AlGaN or GaN, and thereby it is possible to increase the carrier concentration of the entire p-type clad layer 14. Accordingly, it becomes possible to inject a large amount of holes into the light emitting layer 13, and a high level of output of the light emitting device 1 becomes possible. Moreover, since the dopant concentration of each doped film 14b is constant, the carrier concentration of the entire p-type clad layer 14 becomes uniform, and it is possible to inject a large amount of holes into the light emitting layer 13.

The preferred thickness of each of the undoped film 14a and the doped film 14b is 60 Å (6 nm) or less, more preferably 40 Å (4 nm) or less, and most preferably within a range between 10 Å (1 nm) or more and 25 Å (2.5 nm) or less. If the thickness of each of the undoped film 14a and the doped film 14b that form the superlattice structure exceeds 100 Å (10 nm), the layer contains a large amount of crystal defects, and hence this is not preferable.

Moreover, the film thickness of the entire p-type clad layer 14 is not particularly limited. However, it is preferably 1 to 400 nm, or more preferably 5 to 100 nm.

(P-Type Contact Layer)

Next, the p-type contact layer 15 is a layer for providing a positive electrode. The p-type contact layer 15 is preferably $Al_cGa_{1-c}N$ ($0 \leq c \leq 0.4$). If the Al composition is within the above range, this is preferable in terms of maintaining excellent crystallinity and excellent ohmic contact with a p ohmic electrode.

If a p-type impurity (dopant) is contained at a concentration $1 \times 10^{18}$ to $1 \times 10^{21}/cm^3$ or preferably $5 \times 10^{19}$ to $5 \times 10^{20}/cm^3$, this is preferable in terms of maintaining excellent ohmic contact, preventing the occurrence of cracks, and maintaining excellent crystallinity. Specific examples of the preferred p-type impurity, though it is not particularly limited, include Mg. The film thickness of the p-type contact layer 15 is not particularly limited. However, it is preferably 0.01 to 0.5 μm, or more preferably 0.05 to 0.2μ. If the film thickness of the p-type contact layer 15 is within this range, this is preferable in terms of light emission output.

(Transparent Electrode)

The transparent electrode 16 laminated on the p-type contact layer 15 is preferably such that the contact resistance thereof with the p-type contact layer 15 is small. Moreover, in order to efficiently take out light from the light emitting layer 13 to the outside of the light emitting device 1, it is preferable that the transparent electrode 16 have an excellent level of optical transparency. Furthermore, in order to uniformly diffuse electric current across the entire surface of the p-type contact layer 15, it is preferable that the transparent electrode 16 have an excellent level of electrical conductivity.

For these reasons, as a constituent material of the transparent electrode 16, a transparent electrically conductive material selected from a group constituted by any one of an electrically conductive oxide, zinc sulfide, or chrome sulfide that contains any one of In, Zn, Al, Ga, Ti, Bi, Mg, W, and Ce, is preferable. Moreover, specific examples of the preferred electrically conductive oxide include ITO (indium tin oxide ($In_2O_3$—$SnO_2$)), IZO (indium zinc oxide ($In_2O_3$—ZnO)), AZO (aluminum zinc oxide (ZnO—$Al_2O_3$)), GZO (gallium zinc oxide (ZnO—$Ga_2O_3$)), fluorine-doped tin oxide, and titanium oxide.

Furthermore, as also for the structure of the transparent electrode 16, it is possible, without any limitation, to use any structure including conventionally known structures. Moreover, the transparent electrode 16 may be formed so as to cover the entire surface of the p-type contact layer 15, and it may be formed in a grid shape or a tree shape with some openings. Having formed the transparent electrode 16, thermal annealing is carried out with a purpose of alloying or providing transparency in some cases. However, this does not always have to be carried out.

(P-Type Bonding Pad Electrode)

The p-type bonding pad electrode 17 also serves as a bonding pad, and is laminated over the transparent electrode 16. For the p-type bonding pad electrode 17, various types of compositions and structures are widely known, and any one of these known compositions or structures may be used without any limitation. Furthermore, it may be provided by commonly used means well known in this technical field.

(N-Type Electrode)

The n-type electrode 18 also serves as a bonding pad, and is formed so as to be in contact with the n-type semiconductor layer 12 of the laminated semiconductor layer 20. Consequently, when forming the n-type electrode 18, a part of the p-type contact layer 15, the p-type clad layer 14, the light emitting layer 13, and the n-type clad layer 12b is removed to thereby expose the n-type contact layer 12a, and on this exposed surface 20a there is formed the n-type electrode 18 that also serves as a bonding pad. For the n-type electrode 18, various types of compositions and structures are widely known, and any one of these known compositions or structures may be used without any limitation. Furthermore, it may be provided by commonly used means well known in this technical field.

"Method of Manufacturing a Semiconductor Light Emitting Device"

Next, there is described a method of manufacturing a light emitting device of the present embodiment.

In order to manufacture the light emitting device 1 of the present embodiment, first, the substrate 11 such as a sapphire substrate or the like is prepared. Next, on the upper surface of the substrate 11, the buffer layer 21 is formed by means of a sputtering method or MOCVD method. In the case of forming the buffer layer 21 by means of the sputtering method, the ratio of the nitrogen flow rate with respect to the flow rate of nitrogen and inactive gas within the chamber is such that the nitrogen material is 1% to 100%, and preferably 25% to 75%.

Next, having formed the buffer layer 21, the foundation layer 22 is formed on the upper surface of the substrate 11 on which the buffer layer 21 has been formed.

In a case where the buffer layer 21 that is formed earlier has column-shaped crystals formed with MN, in order for the foundation layer 22 not to inherit the crystallinity of the buffer layer 21, dislocation needs to be looped by migration. Therefore, as a method of laminating the foundation layer 22, it is possible, without limitation, to use any crystal growth method that can loop dislocation from the buffer layer 21. For example, the MOCVD method, MBE method, and VPE method can cause the above mentioned migration to occur, and therefore they are suitable methods of forming a film with excellent crystallinity. Above all, the MOCVD method is a more suitable method from the point that a film with the most excellent crystallinity can be obtained.

Having formed the foundation layer 22, the n-type contact layer 12a and the n-type clad layer 12b are laminated to thereby form the n-type semiconductor layer 12. The n-type contact layer 12a and the n-type clad layer 12b may be formed by means of a sputtering method, or may be formed by means of a MOCVD method.

Moreover, in a case where the n-type clad layer 12b is of a superlattice structure, the n-side first layer constituted by a Group III nitride semiconductor having a film thickness of 100 Å or less, and the n-side second layer constituted by a Group III nitride semiconductor having a film thickness of 100 Å or less, and having a composition different from that of the n-side first layer, may be alternately laminated in a repeated manner. In a case of forming the n-type clad layer 12b having a superlattice structure, the MOCVD method is preferable in terms of production efficiency. The n-side first layer and the n-side second layer may each have a dopant added thereto, and moreover, they may be of a combination of a doped structure and an undoped structure. As an impurity to be doped, a conventionally known one may be applied to the abovementioned material compositions without any limitation.

Formation of the light emitting layer 13 may be performed either by means of a sputtering method or a MOCVD method. However, the MOCVD method is particularly preferable. Specifically, formation may be such that with the MOCVD method that uses a reactive gas having a Group III metal source and a nitrogen source, the barrier layer 13a and the well layer 13b are alternately laminated in a repeated manner and they are laminated in an order in which the barrier layer 13a is arranged on the n-type clad layer 12b side and on the p-type clad layer 14 side.

The light emitting layer 13 is formed by: growing the well layer 13b with the temperature of the substrate at T1 (° C.), then growing the barrier layer 13a; then after raising the substrate temperature from T1 (° C.) to T2 (° C.) (where T1 (° C.)<T2 (° C.)), further growing the barrier layer 13a; and then lowering the substrate temperature to T1 (° C.); and in a state where the substrate temperature has been lowered, subsequently, further growing the barrier layer 13a; and repeatedly performing this process.

T1 (° C.) is preferably within a range of 650 to 900° C., more preferably within a range of 650 to 850° C., and most preferably within a range of 680 to 800° C. The temperature T1 is set at 650° C. or more, and consequently the crystallinity of the well layer 13b can be enhanced and light emission characteristics can be improved. Moreover, the temperature T1 (° C.) is 900° C. or less, and consequently the amount of In to be taken into the well layer 13b is not reduced, and it is consequently possible to obtain a device that emits light with a desired wavelength.

T2 (° C.) is preferably within a range of 700 to 1000° C., more preferably within a range of 850 to 1000° C., and most preferably within a range of 900 to 980° C. The temperature T2 is set at 700° C. or more, and consequently the crystallinity of the barrier layer 13a can be enhanced and light emission characteristics can be improved. Moreover, T2 (° C.) is set at 1000° C. or less, and consequently it is possible to reduce damage to the well layer 13b.

Also, by stopping the supply of the Group III metal source while the substrate temperature is raised from T1 (° C.) to T2 (° C.), it is possible, when raising the temperature, to decompose or sublimate part of the well layer to thereby form the thin film section on the well layer.

(P-Type Clad Layer Formation Process)

Next, the p-type clad layer 14 is formed on the light emitting layer 13. The process of forming the p-type clad layer 14 (first p-type semiconductor layer) is a process where an undoped film formation process and a doped film formation process are alternately performed in a repeated manner, to thereby form a superlattice structure in which the undoped film 14a and the doped film 14b are alternately laminated a plurality of times. Moreover, in the present embodiment, it is preferable that a pause process be arranged between the undoped film formation process and the doped film formation process.

<Undoped Film Formation Process>

In the undoped film formation process, first, on the light emitting layer 13, there is laminated the undoped film 14a that is of a composition $Al_xGa_{1-x}N$ (x indicating composition ratio, being within a range of $0<x\leq0.4$) and that contains no dopant, by means of the MOCVD method with use of a first reactive gas that at least contains an Al source, a Ga source, and a nitrogen source.

As the Al source contained in the first reactive gas, trimethyl aluminum (TMA) may be used. As the Ga source, for example, trimethyl gallium (TMG) or triethyl gallium may be used. As the nitrogen source, ammonia, hydrazine, azide compound, or the like may be used. Furthermore, the first reactive gas may contain hydrogen or nitrogen as a carrier gas. The lower limit of the temperature for forming the undoped film 14a, as the temperature of the substrate 11 for example, is preferably 600° C. or more, more preferably 700° C. or more, and most preferably 800° C. or more. Also, the upper limit of the temperature for forming the undoped film 14a, as the temperature of the substrate 11, is preferably 1300° C. or less, more preferably 1200° C. or less, and most preferably 1000° C. or less. The lower limit of the formation temperature is set as described above, and consequently the crystallinity of the undoped film 14a can be enhanced, and light emission characteristics can be improved. Moreover, the upper limit of the formation temperature is set as described above, and consequently damage to the light emitting layer 13 can be reduced.

<Pause Process>

Next, the pause process is performed after the undoped film formation process. In the pause process, only the carrier gas and nitrogen source are flowed, and supply of the Al source and Ga source is stopped. An amount of time required for the pause process (pause time) may be appropriately selected according to the size of the chamber to be used for film formation and the flow rate of the carrier gas to be introduced. However, in general, it may be within a range of 1 to 300 seconds in order to sufficiently ventilate the gas within the chamber.

With this pause process, the Al source remaining within the chamber of an MOCVD apparatus is completely discharged before the doped film formation process. Thereby, in a case where the doped film 14b should not contain Al, the possibility of Al coming to be mixed in the doped film 14b is eliminated. Moreover, also in a case of adding Al to the doped film 14b, since the Al composition ratio in the doped film 14b becomes lower than the Al composition ratio in the undoped film 14a, the concentration of the Al source within the chamber needs to be precisely controlled when switching between the respective processes, and it is preferable that the pause process be provided as an adjustment process therefor.

Moreover, this pause process is also performed after the doped film formation process and before the undoped film formation process. Thereby, the dopant source remaining within the chamber of the MOCVD apparatus is completely discharged before the undoped film formation process. Thereby, the possibility of dopant coming to be mixed in the undoped film 14a is eliminated.

<Doped Film Formation Process>

Next, the doped film formation process is performed after the pause process. In the doped film formation process, on the undoped film 14a that has been formed, there is laminated the doped film 14b that is of a composition $Al_yGa_{1-y}N$ (y indicating composition ratio, being within a range of $0\leq y<0.4$) and that contains a dopant, by means of the MOCVD method with use of a second reactive gas that at least contains a Ga source, a nitrogen source, and a dopant source. In a case the doped film 14b is to contain Al, the Al source may be added to the second reactive gas.

The Ga source and the nitrogen source contained in the second reactive gas may be the same as the Ga source and the nitrogen source contained in the first reactive gas. As the dopant source, bis(cyclopentadienyl)magnesium ($Cp_2Mg$) or the like may be used. Furthermore, the second reactive gas may contain hydrogen or nitrogen as a carrier gas, and it may further have trimethyl aluminum added thereto as the Al source. The lower limit of the temperature for forming the doped film 14b, as a temperature of the substrate 11 for example, is preferably 600° C. or more, more preferably 700° C. or more, and most preferably 800° C. or more. Also, the upper limit of the temperature for forming the doped film 14b, as the temperature of the substrate 11, is preferably 1300° C. or less, more preferably 1200° C. or less, and most preferably 1000° C. or less. The lower limit of the formation temperature is set as described above, and consequently the crystallinity of the doped film 14b can be enhanced, and light emission characteristics can be improved. Moreover, the upper limit of the formation temperature is set as described above, and consequently damage to the light emitting layer 13 can be reduced.

Furthermore, the temperatures for forming the doped film and the undoped film may be the same or may be different. By having the temperatures the same, there is no need for providing an unnecessary stabilization waiting time, and there is consequently an effect of reducing the processes. Moreover, by having the film formation temperature for the doped film set to 10° C. or more above that for the undoped film, it is possible to improve the crystallinity of the layer. More preferably, by having the film formation temperature set to 30° C. or more higher, the effect can be obtained.

Furthermore, the pause process, the undoped film formation process, the pause process, and the doped film formation process are performed repeatedly, and finally the undoped film formation process is performed, to thereby form the p-type clad layer 14 with a superlattice structure.

Figure 2:
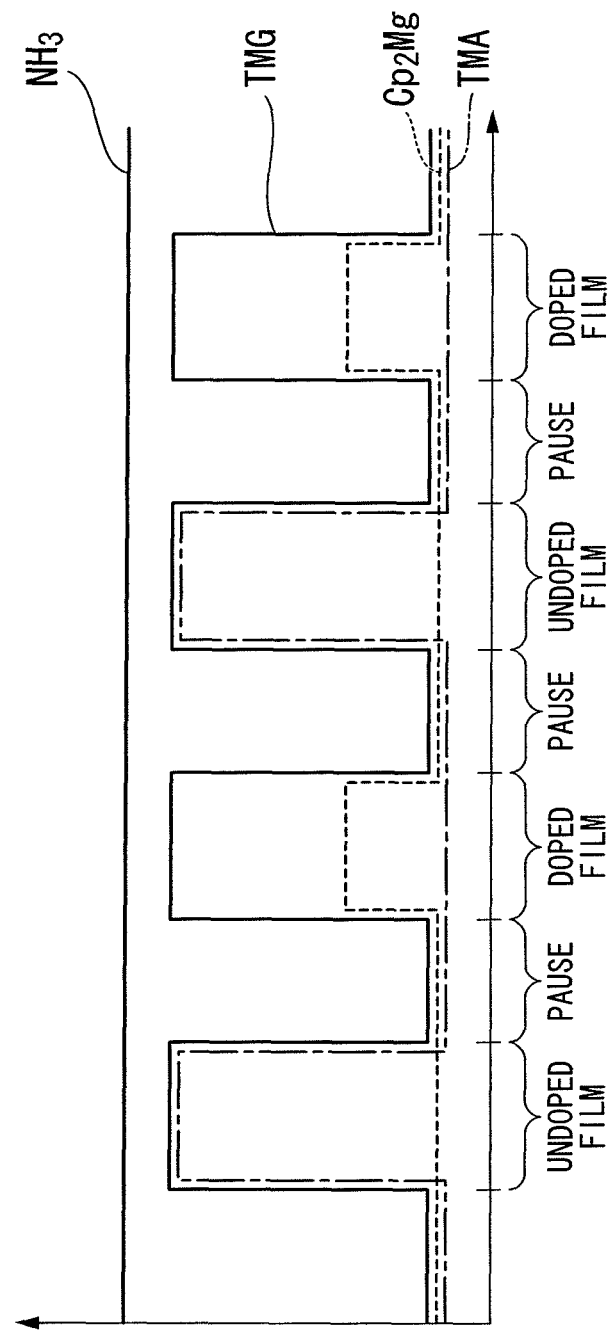
FIG. 2 is a graph for describing a manufacturing method of the Group III nitride compound semiconductor light emitting device of the first embodiment of the present invention.

FIG. 2 is a graph for describing a procedure of supplying a nitrogen source ($NH_3$), a Ga source (TMG), an Al source (TMA), and a dopant source ($Cp_2Mg$) in the p-type clad layer formation process of the present embodiment. In FIG. 2, the horizontal axis represents time and the vertical axis represents supply amount. As shown in FIG. 2, in a state where the nitrogen source ($NH_3$) is constantly supplied, the Ga source (TMG) and the Al source (TMA) are supplied in the undoped film formation process, the Ga source (TMG) and the dopant source ($Cp_2Mg$) are supplied in the doped film formation process, and the Al source (TMA) is further supplied as necessary. In the pause process, only the nitrogen source is flowed. The supply amount of the dopant source ($Cp_2Mg$) is constant in each of the doped film formation processes. Thereby, dopant concentration in each of the doped films 14b becomes constant. Thus, the p-type clad layer 14 according to the present embodiment can be formed.

Next, the p-type contact layer 15 is formed. Formation of the p-type contact layer 15 may be performed either by means of a sputtering method or a MOCVD method. However, in order to form the p-type contact layer 15, following the p-type clad layer 14 formation process, it is preferable that the p-type contact layer 15 be formed by means of the MOCVD method. In order to form the p-type contact layer 15 by means of the MOCVD method, by supplying the nitrogen source, the Ga source, and the dopant source and also supplying the Al source as necessary, a Group III nitride semiconductor is deposited on the p-type clad layer 14 to thereby form the p-type contact layer 15.

After this, the transparent electrode 16 is laminated on the p-type contact layer 15, and the transparent electrode 16 outside a predetermined region is removed, for example, by means of a commonly known photolithography method. Subsequently, the laminated semiconductor layer 20 is patterned, for example, by means of a photolithography technique, and a part of a predetermined region of the laminated semiconductor layer 20 is etched to expose a part of the n-type contact layer 12a, to thereby form the n-type electrode 18 on the exposed surface 20a of the n-type contact layer 12a. Furthermore, on the transparent electrode 16, there is formed the p-type bonding pad electrode 17.

As has been described above, the light emitting device 1 shown in FIG. 1 is manufactured.

According to the light emitting device 1 of the present embodiment, among the two types of films that constitute the superlattice structure, the film that has a lower amount of Al content is doped with the dopant so as to serve as the doped film 14b, and it is consequently possible to increase the carrier concentration of the entire p-type clad layer 14. Moreover, the film that has a higher amount of Al content is not doped with the dopant and serves as the undoped film 14a, and it is consequently possible to increase the crystallinity of the entire p-type clad layer 14.

Thus, the carrier concentration of the p-type clad layer 14 is increased and consequently it becomes possible to inject a large amount of holes into the light emitting layer 13. As a result, a high level of output of the light emitting device 1 can be realized. At the same time, the crystallinity of the p-type clad layer 14 is increased, and consequently the driving voltage of the light emitting device 1 can be reduced.

Moreover, the light emitting layer 13 side surface of the p-type clad layer 14 is configured with the undoped film 14a, and consequently the light emitting layer 13 and the doped film 14b do not come in direct contact with each other. Therefore, there is no possibility that the dopant contained in the doped film 14b is diffused into the light emitting layer 13, and the output can be increased.

Moreover, according to the light emitting device 1 of the present embodiment, by making the dopant concentration of the doped film 14b constant, the carrier concentration of the entire p-type clad layer 14 can be made uniform, and consequently injection of a large amount of holes into the light emitting layer 13 becomes possible. As a result, a high level of output of the light emitting device 1 can be realized.

Furthermore, according to the light emitting device 1 of the present embodiment, the p-type contact layer 15 side surface of the p-type clad layer 14 is configured with the undoped film 14a, and consequently the p-type contact layer 14 and the doped film 14b do not come in direct contact with each other. Therefore an excellent level of crystallinity of the p-type contact layer 14 can be achieved, and it is effective for minute electric current leakage, and also there is an effect of improving electrostatic withstand voltage.

Moreover, according to the light emitting device 1 of the present embodiment, the amount of Al content in the doped film 14b is made lower than that in the undoped film, or preferably the doped film 14b has no Al content, and consequently, it becomes easier to dope the dopant into the doped film 14b, and the carrier concentration of the p-type clad layer 14 can be increased. As a result, a high level of output of the light emitting device 1 can be realized.

Furthermore, according to the light emitting device 1 of the present embodiment, since the thickness of the barrier layer 13 is thin and less than 70 Å, distortion applied to the well layer 13b is reduced and the amount of distortion in the well layer 13b is reduced. Thus, output can be increased. Moreover, although there is a possibility that leak current becomes significant if the barrier layer 13a is made thin, in the present embodiment, the p-type clad layer 14 is formed with the superlattice structure in which the undoped film 14a and the doped film 14b are alternately laminated. Therefore an excellent level of crystallinity can be achieved, and adverse effects associated with thinning of the barrier layer 13a can be eliminated.

According to the method of manufacturing the light emitting device 1 of the present embodiment, among the two types of films that constitute the superlattice structure, the film that has a lower amount of Al content is doped with the dopant so as to serve as the doped film 14b, and it is consequently possible to form the entire p-type clad layer 14 wholly having a high carrier concentration. Moreover, the film that has a higher amount of Al content is not doped with the dopant and serves as the undoped film 14a, and it is consequently possible to form the entire p-type clad layer 14 with a high level of crystallinity.

Thus, the carrier concentration of the p-type clad layer 14 is increased and consequently it becomes possible to inject a large amount of holes into the light emitting layer. As a result, it is possible to manufacture the light emitting device 1 of high output. At the same time, the crystallinity of the p-type clad layer 14 is increased, and it is consequently possible to manufacture the light emitting device 1 that has a low driving voltage.

Moreover, according to method of manufacturing the light emitting device 1 of the present embodiment, the pause process is provided between the undoped film formation process and the doped film formation process, and consequently the Al source that has been used for forming the undoped film 14a is completely discharged from the interior of the chamber of the MOCVD apparatus during the pause process. Thus, the Al source does not remain in the doped film formation process, and it is possible to form the doped film 14b that does not contain Al and that is constituted by GaN. Since the doped film 14b does not contain Al, the dopant can be easily doped into the doped film 14b, and it is consequently possible to form the p-type clad layer 14 wholly having a high carrier concentration. Moreover, even in a case where the doped film 14b contains Al, by providing the pause process, the amount of Al to be doped into the doped film 14b can be precisely controlled.

Second Embodiment

Figure 3:
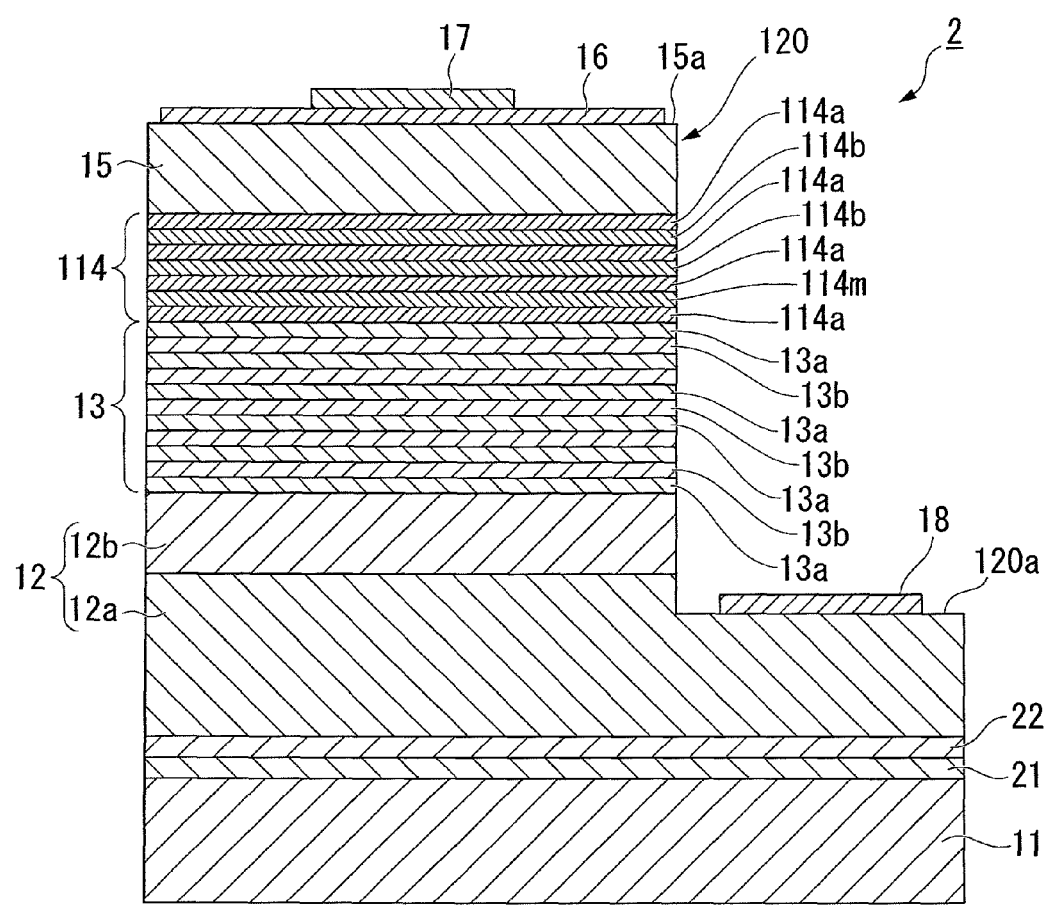
FIG. 3 is a schematic sectional view of a Group III nitride compound semiconductor light emitting device of a second embodiment of the present invention.
Figure 4:
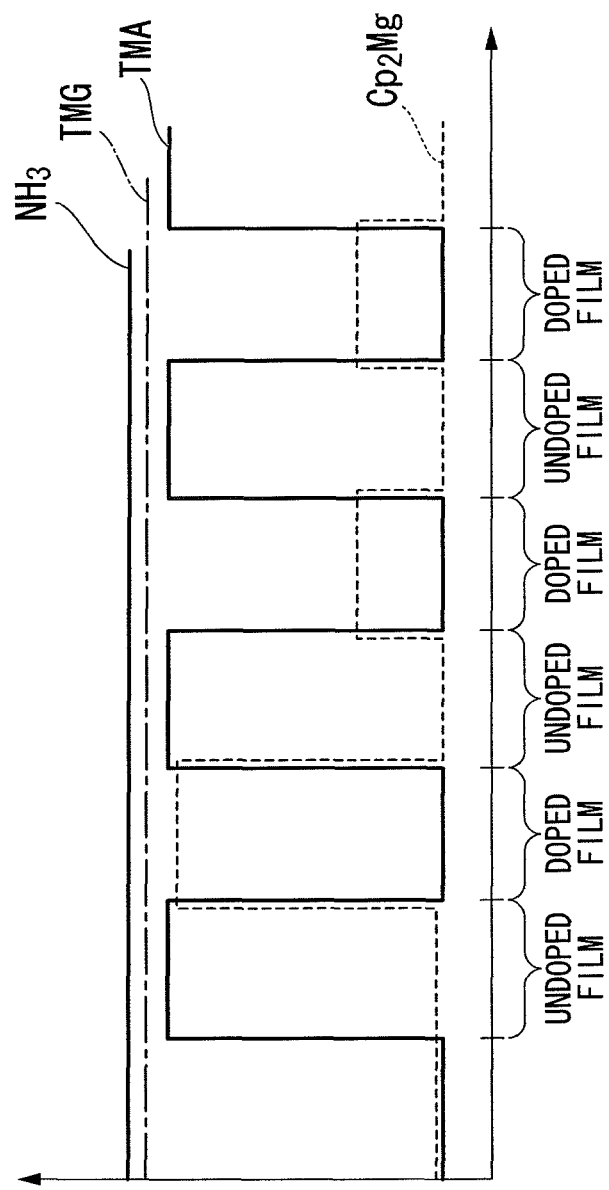
FIG. 4 is a graph for describing a manufacturing method of the Group III nitride compound semiconductor light emitting device of the second embodiment of the present invention.

Next, there are described, with reference to drawings, a light emitting device and a manufacturing method thereof of a second embodiment. FIG. 3 is a schematic sectional view of a light emitting device 2 of the present embodiment, and FIG. 4 is a graph for describing a reactive gas supply procedure in manufacturing the light emitting device 2 of the present embodiment. Moreover, among the constituents shown in FIG. 3, constituents the same as those shown in FIG. 1 are denoted by reference symbols the same as those in FIG. 1, and descriptions thereof are omitted or simplified.

"Light Emitting Device"

The light emitting device 2 of the present embodiment is of a configuration substantially the same as that of the light emitting device 1 of the first embodiment, except for the point that the configuration of a p-type clad layer 114 differs from the configuration of the p-type clad layer 14 in the light emitting device 1 of the first embodiment. Therefore, in the following description, the p-type clad layer 114 is mainly described.

As shown in FIG. 3, the semiconductor light emitting device 2 of the present embodiment is provided with: a substrate 11; a laminated semiconductor layer 120 including an active layer (hereunder, referred to as a light emitting layer) 13; a transparent electrode 16 laminated on the laminated semiconductor layer 120; a p-type bonding pad electrode 17 laminated on the transparent electrode 16; and an n-type electrode 18 laminated on an exposed surface 120a of the laminated semiconductor layer 120.

As shown in FIG. 3, the laminated semiconductor layer 120 is configured such that an n-type semiconductor layer 12, the light emitting layer 13, the p-type clad layer 114 (first p-type semiconductor layer), and a p-type contact layer 15 (second p-type semiconductor layer) are laminated in this order from the substrate 11 side.

(P-Type Clad Layer)

As shown in FIG. 3, the p-type clad layer 114 of the present embodiment is a layer in a superlattice structure in which undoped films 114a and doped films 114m and 114b are alternately laminated a plurality of times.

Among a plurality of the doped films 114m and 114b, the doped film 114m is a film arranged closest to the light emitting layer 13, and the doped films 114b are the other films. Moreover, the p-type clad layer 114 is such that the undoped films 114a are arranged respectively on the light emitting layer 13 side surface and on the p-type contact layer 15 side surface.

It is preferable that compositions of the undoped films 114a and the doped films 114m and 114b be a composition having a bandgap energy greater than that of the light emitting layer 13, and be a composition that is capable of confining the carrier into the light emitting layer 13.

Specifically, as with the case of the first embodiment, the undoped film 114a is preferably of a composition $Al_xGa_{1-x}N$ (x indicating composition ratio, being within a range $0<x\leq0.4$) and does not contain a dopant. The more preferable range of the composition ratio x is $0<x\leq0.2$, and the most preferable range is $0<x\leq0.1$. The undoped film 114a is configured with an AlGaN-based semiconductor that does not contain a dopant, and it is consequently possible to increase the crystallinity of the undoped film 114a. Thus, the crystallinity of the entire p-type clad layer 114 is improved and a reduction in the driving voltage becomes possible. Moreover, the undoped film 114a contains Al, and consequently the carrier can be confined in the light emitting layer 13 easily. However, since the crystallinity of the undoped film 114a decreases if the composition ratio of Al is too high, it is preferable that the upper limit of the composition ratio x be set as described above.

Furthermore, the undoped film 114a arranged closest to the light emitting layer 13 also has a function of blocking diffusion of impurities from the p-type clad layer 114 into the light emitting layer 13. Dopant diffusion of the p-type clad layer 114 due to thermal history in the manufacturing process is an example of diffusion of impurities of the p-type clad layer 114.

Next, the doped films 114m and 114b are preferably of an $Al_yGa_{1-y}N$ composition (y indicating composition ratio, being within a range of $0\leq y<0.4$) and contains a dopant. The more preferable range of the composition ratio y is $0\leq y<0.1$, and the most preferable range is $0\leq y<0.05$. If the composition ratio y of Al is made smaller, it becomes easier to dope the dopant into the doped films 114m and 114b, but on the other hand, by adding Al, the bandgap energy of the p-type clad layer 114 can be increased. Therefore, unlike the doped film 14b of the first embodiment, the doped films 114m and 114b in the present embodiment preferably have Al added thereto.

Moreover, in a case where the composition ratio of the doped film 114m is ym and the composition ratio of the doped film 114b is yb, the difference between them is preferably $0\leq(ym-yb)<0.4$, more preferably $0.01\leq(ym-yb)<0.1$, and most preferably $0.01\leq(ym-yb)<0.05$.

Furthermore, in the present embodiment, the dopant concentration of the doped film 114m positioned closest to the light emitting layer 13 among the plurality of doped films 114m and 114b, is preferably higher than the dopant concentration of the other doped films 114b. Moreover, Mg is a preferable dopant. The preferable dopant concentration of the doped film 114m positioned closest to the light emitting layer 13 is within a range from $1\times10^{16}$ to $5\times10^{21}$ cm$^{-3}$, more preferably within a range from $1\times10^{17}$ to $1\times10^{21}$ cm$^{-3}$, and most preferably within a range from $1\times10^{18}$ to $5\times10^{20}$ cm$^{-3}$. Moreover, the preferable dopant concentration of other the doped films 114b is within a range from $1\times10^{16}$ to $5\times10^{21}$ cm$^{-3}$, more preferably within a range from $1\times10^{17}$ to $1\times10^{21}$ cm$^{-3}$, and most preferably within a range from $1\times10^{18}$ to $5\times10^{20}$ cm$^{-3}$. The preferable dopant concentration ratio of the doped film 114m and doped film 114b is within a range of doped film 114m:doped film 114b=1.1:1 to 3:1, more preferably within a range of 1.3:1 to 3:1, and most preferably within a range of 1.5:1 to 2:1.

The doped films 114m and 114b are preferably configured with an impurity semiconductor constituted by AlGaN, and consequently the carrier concentration of the entire p-type clad layer 114 is increased, and the bandgap energy of the p-type clad layer 114 can be increased. Accordingly, it becomes possible to inject a larger amount of holes into the light emitting layer 13, and a further higher level of output of the light emitting device 2 becomes possible. Moreover, the dopant concentration of the doped film 114b arranged closest to the light emitting layer 13 is made higher than that of the other doped films 11b, and consequently it becomes possible to inject a larger amount of holes into the light emitting layer 13, and a further higher level of output of the light emitting device 2 becomes possible.

The preferred thickness of each of the undoped film 114a and the doped films 114m and 114b is 60 Å (6 nm) or less, more preferably 40 Å (4 nm) or less, and most preferably within a range between 10 Å (1 nm) or more and 25 Å (2.5 nm) or less. If the thickness of each of the undoped film 114a and the doped films 114m and 114b that form the superlattice structure exceeds 100 Å (10 nm), the layer contains a large amount of crystal defects, and hence this is not preferable.

Moreover, the film thickness of the entire p-type clad layer 114 is not particularly limited. However, it is preferably 1 to 400 nm, or more preferably 5 to 100 nm.

"Method of Manufacturing a Light Emitting Device"

The light emitting device 2 of the present embodiment differs from the light emitting device 1 of the first embodiment only in the configuration of the p-type clad layer 114. Therefore, in the following description of the manufacturing method, a process of forming the p-type clad layer 114 is mainly described.

In order to manufacture the light emitting device 2 of the present embodiment, first, as with the first embodiment, on the substrate 11, there are sequentially laminated the buffer layer 21, the foundation layer 22, the n-type contact layer 12a, the n-type clad layer 12b, and the light emitting layer 13.

(P-Type Clad Layer Formation Process)

Next, the p-type clad layer 114 is formed on the light emitting layer 13. The process of forming the p-type clad layer 114 (first p-type semiconductor layer) is a process where an undoped film formation process and a doped film formation process are alternately performed in a repeated manner, to thereby form a superlattice structure in which the undoped film 114a and the doped films 114m and 114b are alternately laminated a plurality of times. Moreover, in the present embodiment, preferably, the undoped film formation process and the doped film formation process are performed continuously.

<Undoped Film Formation Process>

In the undoped film formation process, first, on the light emitting layer 13, there is laminated the undoped film 114a that is of a composition $Al_xGa_{1-x}N$ (x indicating composition ratio, being within a range of $0<x\leq0.4$) and that contains no dopant, by means of the MOCVD method with use of a first reactive gas that at least contains an Al source, a Ga source, and a nitrogen source.

For the Al source, the Ga source, and the nitrogen source contained in the first reactive gas, ones similar to those in the first embodiment may be used. Furthermore, the first reactive gas may contain hydrogen or nitrogen as a carrier gas. The lower limit and upper limit of the temperature for forming the undoped film 114a may be similar to those in the case of the first embodiment.

<Doped Film Formation Process>

Next, following the undoped film formation process, the doped film formation process is performed. In the doped film formation process, on the undoped film 114a that has been formed, there is laminated the doped film 114m that is of a composition $Al_yGa_{1-y}N$ (y indicating composition ratio, being within a range of $0\leq y<0.4$) and that contains a dopant, by means of the MOCVD method with use of a second reactive gas that at least contains a Ga source, a nitrogen source, and a dopant source.

The Ga source and the nitrogen source contained in the second reactive gas may be the same as the Ga source and the nitrogen source contained in the first reactive gas. For the dopant source, bis(cyclopentadienyl)magnesium ($Cp_2Mg$) or the like may be used. Furthermore, the second reactive gas may contain hydrogen or nitrogen as a carrier gas.

The Al source is not contained in the second reactive gas. However, immediately after completion of the undoped film formation process, the Al source that has been used in the undoped film formation process still remains within the chamber of the MOCVD reaction apparatus. In the doped film formation process of the present embodiment, film formation is performed by means of the MOCVD method in a state where the Al source is mixed in the second reactive gas. As a result, the formed doped film 114m contains Al. Thus, there is formed the doped film 114m constituted by gallium nitride (GaN) where a part of the Ga is replaced with Al.

The lower limit and upper limit of the temperature for forming the doped film 114m may be similar to those in the case of the first embodiment.

Furthermore, the undoped film formation process and the doped film formation process are performed repeatedly, and finally the undoped film formation process is performed, to thereby form the p-type clad layer 114 with a superlattice structure. The second-time and subsequent doped film formation processes may be performed under film formation conditions the same as those for the first-time doped film formation process, except the amount of dopant source supply is made lower than that in the first-time doped film formation process. Thereby, there is formed the doped film 114b with a dopant concentration lower than that of the doped film 114m of the first layer.

In FIG. 4, there is shown, with a graph, the procedure of supplying a nitrogen source ($NH_3$), a Ga source (TMG), an Al source (TMA), and a dopant source ($Cp_2Mg$) in the p-type clad layer formation process of the present embodiment. In FIG. 4, the horizontal axis represents time and the vertical axis represents supply amount. As shown in FIG. 4, in a state where the nitrogen source is constantly supplied, the Ga source (TMG) and the Al source (TMA) are supplied in the undoped film formation process, and the Ga source (TMG) and the dopant source ($Cp_2Mg$) are supplied in the doped film formation process.

Regarding the supply amount of dopant source, the supply amount in the first-time doped film formation process is, for example, three times the supply amount in the second-time doped film formation process. Consequently, the dopant concentration of the doped film 114m becomes higher than the dopant concentration of the other doped films 114b. Thus, the p-type clad layer 114 according to the present embodiment can be formed.

Subsequently, the p-type contact layer 15, the transparent electrode 16, the n-type electrode 18, and the p-type bonding pad electrode 17 are formed, and thereby the light emitting device 2 of the present embodiment is completed.

According to the present embodiment, in addition to effects similar to those of the light emitting device 1 and the manufacturing method thereof of the first embodiment, the following effects can also be obtained.

That is to say, according to the light emitting device 2 of the present embodiment, the dopant concentration of the doped film 114m arranged closest to the light emitting layer 13 is higher than that of the other doped films 114b, and consequently it becomes possible to inject a larger amount of holes into the light emitting layer 13, and a further higher level of output of the light emitting device 2 becomes possible.

Moreover, by adding Al to the doped films 114m and 114b, the bandgap energy of the p-type clad layer 114 can be further increased, and accordingly a further higher level of output of the light emitting device 2 can be realized.

Furthermore, according to the method of manufacturing the light emitting device 2 of the present embodiment, since the undoped film formation process and the doped film formation process are continuously performed, the doped film formation process is commenced before the Al source that has been used for forming the undoped film 114a, is completely discharged from the interior of the chamber of the MOCVD apparatus. Accordingly, in the doped film formation process, the Al source remains in the second reactive gas, and consequently, the doped films 114m and 114b contain Al. The doped films 114m and 114b contain a small amount of Al and become AlGaN-based films, and consequently, the bandgap energy of the p-type clad layer 114 can be further increased, and it is possible to manufacture the light emitting device 2 of higher output.

The dopant source remains still remains within the chamber immediately after the completion of the doped film formation process. However, the undoped film that is formed in the undoped film formation process has a comparatively high amount of Al content and the dopant cannot be easily doped thereinto. Therefore, there is almost no possibility that the dopant comes to be mixed into the undoped film even if the dopant source still remains.

Third Embodiment

Figure 5:
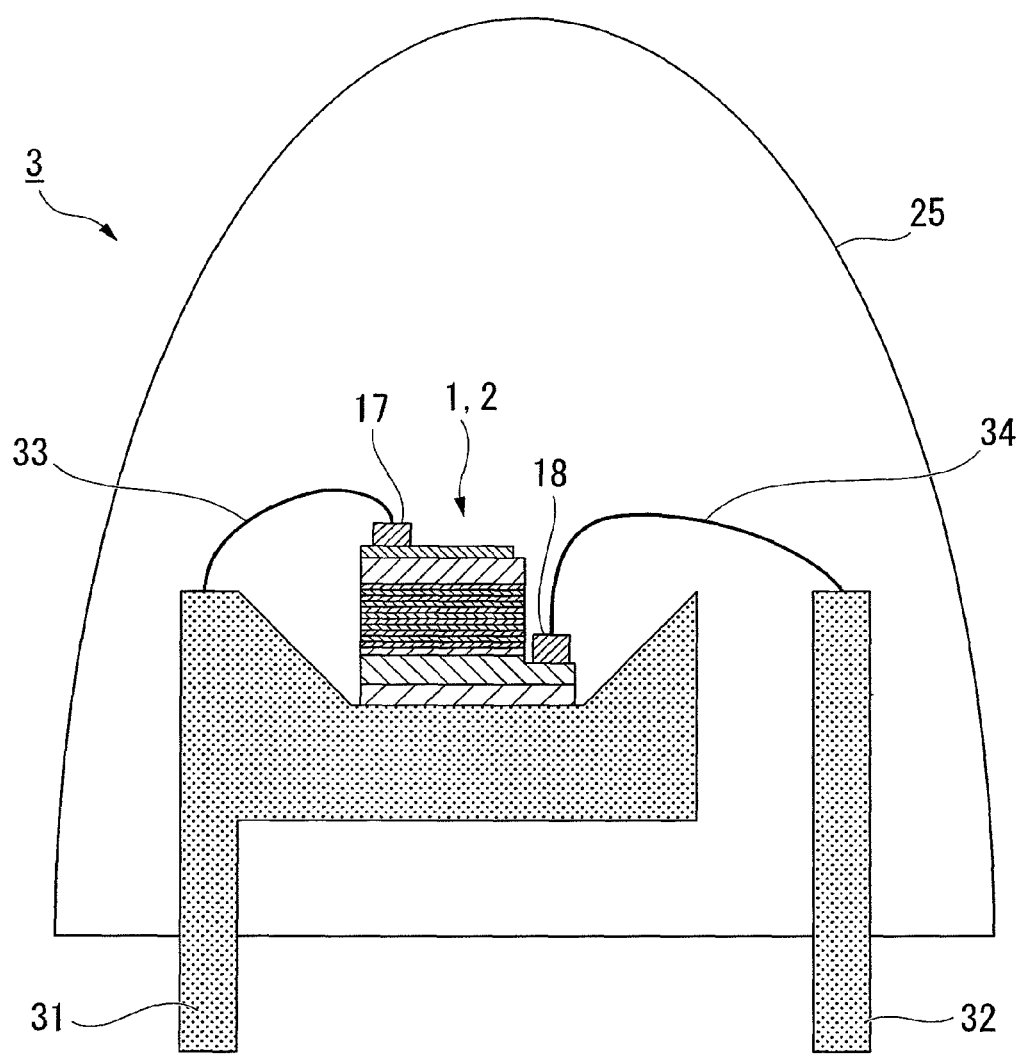
FIG. 5 is a schematic sectional view of a lamp provided with a Group III nitride compound semiconductor light emitting device of a third embodiment of the present invention.

FIG. 5 is a schematic sectional view of a lamp of a third embodiment of the present invention. This lamp is configured to be provided with the light emitting device 1 or 2 of the first or second embodiment.

Examples of the lamp of the present embodiment include one that combines the light emitting device 1 or 2 of the first or second embodiment with a fluorescent substance. The lamp that combines the light emitting device 1 or 2 with a fluorescent substance may be of a configuration that is known to and realized by those skilled in the art.

Moreover, there has been conventionally known a technique in which a light emitting device is combined with a phosphor to thereby change the light emission color, and also in the lamp of the present embodiment, it is possible, without any limitation, to employ such technique.

FIG. 5 is a schematic drawing that schematically shows an example of a lamp configured with use of the light emitting device 1 or 2. A lamp 3 shown in FIG. 5 is of a shell type, and uses the light emitting device 1 or 2 shown in FIG. 1 or FIG. 3. As shown in FIG. 5, the semiconductor light emitting device 1 or 2 is mounted such that the p-type bonding pad electrode 17 of the semiconductor light emitting device 1 or 2 is adhered to one of two frames 31 and 32 (frame 31 in FIG. 5) via a wire 33, and the n-type electrode 18 (bonding pad) of the light emitting device 1 or 2 is joined to the other frame 32 via a wire 34. Moreover, the periphery of the semiconductor light emitting device 1 or 2 is sealed with a mold 35 made of a transparent resin.

The lamp 3 of the present embodiment is configured with use of the above semiconductor light emitting device 1 or 2, and it is therefore provided with an excellent level of light emission characteristics.

The lamp 3 of the present embodiment may be used for any purpose including a shell type for a general purpose, a side view type for a portable backlight purpose, and a top view type to be used for a display device.

WORKING EXAMPLES

Hereunder, the present invention is described in further detail, with working examples.

Working Example 1

A light emitting device constituted by a gallium nitride-based compound semiconductor shown in FIG. 1 was manufactured. First, on the substrate 11 made of sapphire, there were sequentially laminated via a buffer layer 21: a foundation layer 22 with 8 μm of thickness constituted by undoped GaN; a Si doped n-type GaN contact layer 12a with 2 μm of thickness; an n-type $Ga_{0.9}In_{0.1}N$ clad layer 12b with 250 μM of thickness; and a light emitting layer 13 of a multiple quantum well structure in which a Si doped GaN barrier layer with 5 nm of thickness and a $Ga_{0.8}In_{0.2}N$ well layer with 2.5 nm of thickness are laminated five times and a final barrier layer is provided thereon. All of these films were formed by means of the MOCVD method with use of reactive gases such as trimethyl gallium (TMG), trimethyl aluminum (TMA), trimethyl indium (TMIn), ammonia ($NH_3$), bis(cyclopentadienyl)magnesium ($Cp_2Mg$), silane ($SiH_4$), or the like.

Next, following the above mentioned respective processes, with use of the same MOCVD apparatus, four layers of an undoped film constituted by $Al_{0.06}Ga_{0.94}N$ and three layers of an Mg-doped doped film constituted by GaN were alternately laminated, to thereby form a p-type clad layer 14 having a superlattice structure.

More specifically, after the supply of TMG was stopped and the growth of the GaN barrier layer was completed, the temperature of the substrate was raised to 975° C. while supplying $NH_3$ gas. At 975° C., the type of carrier gas was switched from nitrogen to hydrogen. Subsequently, the pressure within the chamber of the MOCVD apparatus was changed to 15 kPa, and the substrate temperature was changed to 1050° C. Having waited for the pressure and the substrate temperature within the chamber to stabilize, TMG and TAM were supplied into the chamber together with $NH_3$, to thereby form the undoped film constituted by $Al_{0.06}Ga_{0.94}N$ with 2.5 nm of thickness.

Next, having stopped the supply of TMG and TAM and completed a three-second pause process, TMG and $Cp_2Mg$ were supplied and thereby the doped film constituted by Mg-doped doped film with 2.5 nm thickness was formed.

Subsequently, the pause process, the undoped film formation process, the pause process, and the doped film formation process were sequentially repeated, and finally the undoped film constituted by $Al_{0.06}Ga_{0.94}N$ was formed, to thereby form the p-type clad layer of a superlattice structure.

After this, while maintaining the substrate temperature, pressure, and carrier gas type the same, only $Cp_2Mg$ and TMG were supplied into a furnace, and thereby an Mg doped p-type contact layer constituted by GaN with 200 nm of thickness was formed.

Furthermore, on the p-type contact layer, a transparent electrode constituted by ITO with 200 nm of thickness was formed by means of a commonly known photolithography method.

On the transparent electrode, there was formed, by means of photolithography, a p-type bonding pad of a three-layer structure constituted by a metal reflective layer constituted by Al with 200 nm of thickness, a bather layer constituted by Ti with 80 nm of thickness, and a bonding layer constituted by Au with 200 nm of thickness.

Next, etching was performed, also by means of the photolithography method, to thereby expose the n-type contact layer in a desired region, and on this n-type contact layer, there was formed an n-type electrode having a metal lamination structure, to thereby provide a light output surface on the semiconductor side.

In this structure, the Si dopant concentration of the n-type contact layer was $7 \times 10^{18}$ cm$^{-3}$, the Si dopant concentration of the n-type clad layer was $2 \times 10^{19}$ cm$^{-3}$, the Si dopant concentration of the GaN barrier layer was $1 \times 10^{18}$ cm$^{-3}$, the Mg dopant concentration of the p-type clad layer was $1 \times 10^{21}$ cm$^{-3}$, and the Mg dopant concentration of the p-type contact layer was $1.5 \times 10^{20}$ cm$^{-3}$.

When the voltage in the forward direction was measured for the light emitting device of the working example 1, the voltage in the forward direction at an applied electric current of 20 mA energized using a probe needle, was found to be 3.0 V.

Moreover, subsequently, when the light emitting device was mounted on a TO-18 can package and light emission was measured with a tester, the light emission output at an applied electric current of 20 mA was found to be 23 mW. Moreover, as regards the light emission distribution on the light emission surface, it was confirmed to be emitting light throughout the entire surface under the positive electrode.

Working Example 2

As with the working example 1, on the substrate 11 made of sapphire, there were sequentially laminated via a buffer layer 21: a foundation layer 22 with 8 μm of thickness constituted by undoped GaN; a Si doped n-type GaN contact layer 12a with 2 μm of thickness; an n-type $Ga_{0.9}In_{0.1}N$ clad layer 12b with 250 μm of thickness; and a light emitting layer 13 of a multiple quantum well structure in which a Si doped GaN barrier layer with 5 nm of thickness and a $Ga_{0.8}In_{0.2}N$ well layer with 2.5 nm of thickness are laminated five times and a final barrier layer is provided thereon.

Next, following the above mentioned respective processes, with use of the same MOCVD apparatus, four layers of an undoped film constituted by $Al_{0.06}Ga_{0.94}N$ and three layers of an Mg-doped doped film constituted by $Al_{0.01}Ga_{0.99}N$ were alternately laminated, to thereby form a p-type clad layer 14 having a superlattice structure.

More specifically, after the supply of TMG was stopped and the growth of the GaN barrier layer was completed, the temperature of the substrate was raised to 975° C. while supplying NH$_3$ gas. At 975° C., the type of carrier gas was switched from nitrogen to hydrogen. Subsequently, the pressure within the chamber of the MOCVD apparatus was changed to 15 kPa, and the substrate temperature was changed to 1050° C. Having waited for the pressure and the substrate temperature within the chamber to stabilize, TMG and TAM were supplied into the chamber together with NH$_3$, to thereby form the undoped film constituted by $Al_{0.06}Ga_{0.94}N$ with 2.5 nm of thickness.

Next, the supply of TMA was stopped and the supply of Cp$_2$Mg was commenced, to thereby form an Mg-doped doped film with 2.5 nm of thickness constituted by $Al_{0.01}Ga_{0.99}N$. The supply of TMA was stopped when forming the doped film. However, TMA remaining within the chamber was taken into the crystals of the doped film and Al came to be mixed in the doped film as a result, and consequently there was formed the doped film of the composition $Al_{0.01}Ga_{0.99}N$.

Subsequently, the undoped film formation process and the doped film formation process were sequentially repeated, and finally an undoped film constituted by $Al_{0.06}Ga_{0.94}N$ was formed, to thereby form the p-type clad layer of a superlattice structure. The supply amount of Cp$_2$Mg in the second-time and subsequent doped film formation processes was one third of the supply amount of Cp$_2$Mg in the first-time doped film formation process.

After this, while maintaining the substrate temperature, pressure, and carrier gas type the same, only Cp$_2$Mg and TMG were supplied into a furnace, and thereby an Mg doped p-type contact layer constituted by GaN with 200 nm of thickness was formed.

Furthermore, as with the working example 1: a transparent electrode was formed on the p-type contact layer; a p-type bonding pad was formed on the transparent electrode; the n-type contact layer was exposed by means of a photolithography method; and an n-type electrode was formed on this n-type contact layer, to thereby provide a light output surface on the semiconductor side.

In this structure, the Si dopant concentration of the n-type contact layer was $7 \times 10^{18}$ cm$^{-3}$, the Si dopant concentration of the n-type clad layer was $2 \times 10^{19}$ cm$^{-3}$, the Si dopant concentration of the GaN barrier layer was $1 \times 10^{18}$ cm$^{-3}$, the Mg dopant concentration of the p-type clad layer closest to the light emitting layer among the doped films of the p-type clad layer was $2 \times 10^{21}$ cm$^{-3}$, the Mg dopant concentration of the other doped films was $1 \times 10^{21}$ cm$^{-3}$, and the Mg dopant concentration of the p-type contact layer was $1.5 \times 10^{20}$ cm$^{-3}$.

When the voltage in the forward direction was measured for the light emitting device of the working example 2, the voltage in the forward direction at an applied electric current of 20 mA energized using a probe needle, was found to be 2.0 V.

Moreover, subsequently, when the light emitting device was mounted on a TO-18 can package and light emission was measured with a tester, the light emission output at an applied electric current of 20 mA was found to be 22.5 mW. Moreover, as regards the light emission distribution on the light emission surface, it was confirmed to be emitting light throughout the whole light emitting surface under the positive electrode.

Working Example 3 to Comparative Example 6

A light emitting device of working example 3 to comparative example 6 was manufactured as with the above working example 1, except that: formation conditions of the p-type clad layer were changed; and the composition and film thickness of an undoped film, the composition, dopant concentration and film thickness of a doped film, the composition and film thickness of a bather layer, and the composition and film thickness of a well layer were changed as shown in Table 1.

Moreover, as with the case of the working example 1, the voltage in the forward direction and light emission output were measured for the light emitting device of the working example 3 to comparative example 6. Results are shown in Table 2. The thickness of each layer shown in Table 1 is a condition of film formation when forming a film.

TABLE 1

| | Barrier layer | | Well layer | | Undoped film | | Doped film | | | | |
|---|---|---|---|---|---|---|---|---|---|---|---|
| | Composition | Thickness (nm) | Composition | Thickness (nm) | Composition | Thickness (nm) | Composition | Thickness (nm) | Dopant concentration of first layer (cm$^{-3}$) | Dopant concentration of first and subsequent layers (cm$^{-3}$) | Pause process |
| Working example 1 | GaN | 5 | $Ga_{0.8}In_{0.2}N$ | 2.5 | $Al_{0.06}Ga_{0.94}N$ | 2.5 | GaN | 2.5 | $1 \times 10^{21}$ | $1 \times 10^{21}$ | Yes |
| Working example 2 | GaN | 5 | $Ga_{0.8}In_{0.2}N$ | 2.5 | $Al_{0.06}Ga_{0.94}N$ | 2.5 | $Al_{0.01}Ga_{0.99}N$ | 2.5 | $2 \times 10^{21}$ | $1 \times 10^{21}$ | No |
| Working example 3 | GaN | 3 | $Ga_{0.8}In_{0.2}N$ | 2.5 | $Al_{0.06}Ga_{0.94}N$ | 2.5 | GaN | 2.5 | $1 \times 10^{21}$ | $1 \times 10^{21}$ | Yes |
| Working example 4 | GaN | 7 | $Ga_{0.8}In_{0.2}N$ | 2.5 | $Al_{0.06}Ga_{0.94}N$ | 2.5 | GaN | 2.5 | $1 \times 10^{21}$ | $1 \times 10^{21}$ | Yes |
| Working example 5 | GaN | 5 | $Ga_{0.8}In_{0.2}N$ | 2.5 | $Al_{0.02}Ga_{0.8}N$ | 2.5 | GaN | 2.5 | $1 \times 10^{21}$ | $1 \times 10^{21}$ | Yes |
| Working example 6 | GaN | 5 | $Ga_{0.8}In_{0.2}N$ | 2.5 | $Al_{0.01}Ga_{0.99}N$ | 2.5 | GaN | 2.5 | $1 \times 10^{21}$ | $1 \times 10^{21}$ | Yes |
| Working example 7 | GaN | 5 | $Ga_{0.8}In_{0.2}N$ | 2.5 | $A_{0.02}Ga_{0.8}N$ | 2.5 | $Al_{0.05}Ga_{0.95}N$ | 2.5 | $1 \times 10^{21}$ | $1 \times 10^{21}$ | Yes |
| Working example 8 | GaN | 5 | $Ga_{0.8}In_{0.2}N$ | 2.5 | $Al_{0.06}Ga_{0.94}N$ | 5 | GaN | 5 | $1 \times 10^{21}$ | $1 \times 10^{21}$ | Yes |
| Working example 9 | GaN | 5 | $Ga_{0.8}In_{0.2}N$ | 2.5 | $Al_{0.06}Ga_{0.94}N$ | 1 | GaN | 1 | $1 \times 10^{21}$ | $1 \times 10^{21}$ | Yes |
| Working example 10 | GaN | 5 | $Ga_{0.8}In_{0.2}N$ | 2.5 | $Al_{0.06}Ga_{0.94}N$ | 2.5 | GaN | 2.5 | $1 \times 10^{19}$ | $1 \times 10^{19}$ | Yes |
| Working example 11 | GaN | 5 | $Ga_{0.8}In_{0.2}N$ | 2.5 | $Al_{0.06}Ga_{0.94}N$ | 2.5 | GaN | 2.5 | $1 \times 10^{20}$ | $1 \times 10^{20}$ | Yes |
| Working example 12 | GaN | 5 | $Ga_{0.8}In_{0.2}N$ | 2.5 | $Al_{0.06}Ga_{0.94}N$ | 2.5 | GaN | 2.5 | $2 \times 10^{21}$ | $1 \times 10^{20}$ | Yes |
| Working example 13 | GaN | 5 | $Ga_{0.8}In_{0.2}N$ | 2.5 | $Al_{0.06}Ga_{0.94}N$ | 2.5 | GaN | 2.5 | $3 \times 10^{20}$ | $1 \times 10^{20}$ | Yes |
| Working example 14 | $Ga_{0.95}In_{0.05}N$ | 5 | $Ga_{0.8}In_{0.2}N$ | 2.5 | $Al_{0.06}Ga_{0.94}N$ | 2.5 | $Al_{0.01}Ga_{0.99}N$ | 2.5 | $2 \times 10^{21}$ | $1 \times 10^{21}$ | No |
| Working example 15 | GaN | 5 | $Ga_{0.8}In_{0.2}N$ | 2.5 | $Al_{0.06}Ga_{0.94}N$ | 2.5 | $Al_{0.01}Ga_{0.99}N$ | 2.5 | $2 \times 10^{21}$ | $1 \times 10^{21}$ | No |
| Comparative example 1 | GaN | 15 | $Ga_{0.8}In_{0.2}N$ | 2.5 | $Al_{0.06}Ga_{0.94}N$ | 2.5 | GaN | 2.5 | $1 \times 10^{21}$ | $1 \times 10^{21}$ | Yes |
| Comparative example 2 | GaN | 5 | $Ga_{0.8}In_{0.2}N$ | 2.5 | GaN | 2.5 | GaN | 2.5 | $1 \times 10^{21}$ | $1 \times 10^{21}$ | Yes |
| Comparative example 3 | GaN | 5 | $Ga_{0.8}In_{0.2}N$ | 2.5 | $Al_{0.06}Ga_{0.94}N$ | 2.5 | $Al_{0.06}Ga_{0.94}N$ | 2.5 | $1 \times 10^{20}$ | $1 \times 10^{20}$ | Yes |
| Comparative example 4 | GaN | 5 | $Ga_{0.8}In_{0.2}N$ | 2.5 | $Al_{0.06}Ga_{0.94}N$ | 2.5 | GaN | 2.5 | $1 \times 10^{16}$ | $1 \times 10^{16}$ | Yes |
| Comparative example 5 | GaN | 5 | $Ga_{0.8}In_{0.2}N$ | 2.5 | $Al_{0.06}Ga_{0.94}N$ | 10 | GaN | 10 | $1 \times 10^{21}$ | $1 \times 10^{21}$ | Yes |
| Comparative example 6 | GaN | 5 | $Ga_{0.8}In_{0.2}N$ | 2.5 | GaN | 2.5 | $Al_{0.2}Ga_{0.8}N$ | 2.5 | $1 \times 10^{16}$ | $1 \times 10^{16}$ | Yes |

TABLE 2

| | Voltage in forward direction (V) | Light emission output (mW) |
|---|---|---|
| Working example 1 | 3 | 23 |
| Working example 2 | 2.9 | 22.5 |
| Working example 3 | 2.85 | 21 |
| Working example 4 | 3.2 | 25 |
| Working example 5 | 3.1 | 25 |
| Working example 6 | 2.95 | 22 |
| Working example 7 | 3.1 | 23.5 |
| Working example 8 | 3 | 23 |
| Working example 9 | 3 | 23 |
| Working example 10 | 2.8 | 24 |
| Working example 11 | 2.85 | 24.5 |
| Working example 12 | 2.85 | 25.5 |
| Working example 13 | 2.8 | 25.5 |
| Working example 14 | 2.9 | 26 |
| Working example 15 | 2.8 | 18 |
| Comparative example 1 | 3.3 | 18 |
| Comparative example 2 | 3 | 19 |
| Comparative example 3 | 3.4 | 23 |
| Comparative example 4 | 5 | No light emission |
| Comparative example 5 | 3.2 | 17 |
| Comparative example 6 | 5 | No light emission |

As shown in Table 2, in all of the working examples 1 to 15, the light emitting device had a high level of brightness and a low level of electric power consumption while the voltage in the forward direction was comparatively low and the light emission output was 20 mW or more.

On the other hand, in the comparative examples 1 to 6, the driving voltage rose significantly, or the light emission output dropped significantly.

INDUSTRIAL APPLICABILITY

A light emitting device of the present invention is configured to be provided with: a substrate, a laminated semiconductor layer including a Group III nitride compound semiconductor light emitting layer laminated on the substrate, a transparent electrode laminated on the upper surface of the laminated semiconductor layer; a p-type bonding pad electrode laminated on the transparent electrode; and an n-type electrode laminated on an exposed surface of the laminated semiconductor layer. This light emitting device is a face-up mount type light emitting device that takes out the light from the light emitting layer primarily from the side on which the p-type bonding pad electrode is formed. This light emitting device can be used not only as a light emitting device having a high level of light emission output but also as an illuminating device that uses the light emitting device, and therefore, it is used, along with a manufacturing method thereof, in a wide range of industrial fields.

The invention claimed is:

1. A Group III nitride compound semiconductor light emitting device comprising:
   an n-type semiconductor layer,
   an active layer composed of a multiple quantum-well structure laminated on said n-type semiconductor layer,
   a first p-type semiconductor layer laminated on said active layer, and
   a second p-type semiconductor layer laminated on said first p-type semiconductor layer, wherein
   said first p-type semiconductor layer is a superlattice structure in which an undoped film that has a composition of $Al_xGa_{1-x}N$ (x indicating composition ratio, being within a range $0<x\leq0.4$) and that contains no dopant, and a doped film that has a composition of $Al_yGa_{1-y}N$ (y indicating composition ratio, being within a range $0\leq y<0.4$) and that contains a dopant, are alternately laminated a plurality of times;
   an Al content in the doped film in the first p-type semiconductor layer is less than the Al content in the undoped film;
   a first surface film in said first p-type semiconductor layer being in direct contact with said active layer is constituted by a first undoped film of the first p-type semiconductor layer; and
   a second surface film in said first p-type semiconductor layer being in direct contact with said second p-type semiconductor layer is constituted by a second undoped film of the first p-type semiconductor layer.

2. The Group III nitride compound semiconductor light emitting device according to claim 1, wherein a dopant concentration of a plurality of said doped films that constitute said first p-type semiconductor layer is constant.

3. The Group III nitride compound semiconductor light emitting device according to claim 1, wherein a dopant concentration of a closest doped film arranged closest to said active layer, among the plurality of doped films that constitute said first p-type semiconductor layer, is higher than a dopant concentration of doped films other than the closest doped film.

4. The Group III nitride compound semiconductor light emitting device according to claim 1, wherein said doped film is constituted by GaN.

5. The Group III nitride compound semiconductor light emitting device according to claim 1, wherein said active layer is composed of a multiple well structure in which a well layer, and a barrier layer with a film thickness of 20 Å or more and less than 70 Å, are alternately laminated a plurality of times.

6. The Group III nitride compound semiconductor light emitting device according to claim 1, wherein said first p-type semiconductor layer is a p-type clad layer, and said second p-type semiconductor layer is a p-type contact layer.

7. The illuminating device wherein the illuminating device is provided with a Group III nitride compound semiconductor light emitting device according to claim 1.

8. A method of manufacturing a Group III nitride compound semiconductor light emitting device comprising:
   an n-type semiconductor layer,
   an active layer composed of a multiple quantum-well structure laminated on the n-type semiconductor layer,
   a first p-type semiconductor layer laminated on the active layer, and
   a second p-type semiconductor layer laminated on the first p-type semiconductor layer, wherein
   the first p-type semiconductor layer is a superlattice structure in which an undoped film that has a composition of $Al_xGa_{1-x}N$ (x indicating composition ratio, being within a range $0<x\leq0.4$) and that contains no dopant, and a doped film that has a composition of $Al_yGa_{1-y}N$ (y indicating composition ratio, being within a range $0\leq y<0.4$) and that contains a dopant, are alternately laminated a plurality of times;
   an Al content in the doped film in the first p-type semiconductor layer is less than the Al content in the undoped film;
   a first surface film in the first p-type semiconductor layer being in direct contact with the active layer is constituted by a first undoped film of the first p-type semiconductor layer; and
   a second surface film in said first p-type semiconductor layer being in direct contact with said second p-type semiconductor layer is constituted by a second undoped film of the first p-type semiconductor layer,
   the method comprising the steps of:
   a step of laminating, on the n-type semiconductor layer and the active layer composed of the multiple quantum well structure, the first p-type semiconductor layer of the super lattice structure comprising, an undoped film formation process in which the undoped film that has the composition $Al_xGa_{1-x}N$ (x indicating composition ratio, being within a range of $0<x\leq0.4$) and that contains no dopant is laminated by means of a MOCVD method with use of a first reactive gas at least containing an Al source, a Ga source, and a nitrogen source; and a doped film formation process in which the doped film that has the composition $Al_yGa_{1-y}N$ (y indicating composition ratio, being within a range of $0\leq y<0.4$) and that contains the dopant is laminated by means of the MOCVD method with use of a second reactive gas at least containing a Ga source, a nitrogen source, and a dopant source, to thereby form the first p-type semiconductor layer of the superlattice structure in which said undoped film and said doped film are alternately laminated the plurality of times; and
   a step of laminating the second p-type semiconductor layer on said first p-type semiconductor layer.

9. The method of manufacturing a Group III nitride compound semiconductor light emitting device according to claim 8, wherein, between said undoped film formation process and said doped film formation process, there is provided a pause process.

10. The method of manufacturing a Group III nitride compound semiconductor light emitting device according to claim 8, wherein said undoped film formation process and said doped film formation process are performed continuously.

* * * * *